(12) United States Patent
Zhang et al.

(10) Patent No.: US 11,527,585 B2
(45) Date of Patent: Dec. 13, 2022

(54) DISPLAY PANEL, PREPARATION METHOD THEREOF AND DISPLAY DEVICE

(71) Applicant: Xiamen Tianma Micro-Electronics Co., Ltd., Xiamen (CN)

(72) Inventors: Qing Zhang, Shanghai (CN); Feng Lu, Shanghai (CN); Yang Zeng, Shanghai (CN); Qijun Yao, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/164,427

(22) Filed: Feb. 1, 2021

(65) Prior Publication Data

US 2021/0183957 A1     Jun. 17, 2021

(30) Foreign Application Priority Data

Oct. 29, 2020 (CN) .......................... 202011187301.1

(51) Int. Cl.
*H01L 27/32* (2006.01)
*H01L 51/00* (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC ...... B29C 66/742; F16B 7/18; F16C 2226/10; F16C 2226/60; F16C 2229/00;
(Continued)

(56) References Cited

U.S. PATENT DOCUMENTS

| 6,992,330 B2 * | 1/2006 | Fery | ...................... H01L 51/524 |
| | | | 257/79 |
| 2013/0112955 A1 * | 5/2013 | Yamazaki | ............. H01L 51/525 |
| | | | 257/40 |

(Continued)

FOREIGN PATENT DOCUMENTS

| CN | 103487971 B | 5/2016 |
| CN | 105118928 B | 2/2018 |
| CN | 111736388 A | 10/2020 |

OTHER PUBLICATIONS

Chinese Office Action issued in related application CN202011187301. 1; report dated Mar. 2, 2022.

*Primary Examiner* — Kwin Xie
(74) *Attorney, Agent, or Firm* — von Briesen & Roper, s.c.

(57) ABSTRACT

Provided are a display panel, a preparation method thereof and a display device. The display panel includes a light-emitting substrate and a color filter substrate; the color filter substrate includes: a substrate, a baffle wall layer and a reflective metal layer. The baffle wall layer is located on one side of the substrate and includes multiple baffle wall structures; the reflective metal layer includes a first reflective subsection covering a surface on a side, close to the light-emitting substrate, of the multiple baffle wall structures; the first reflective subsection includes multiple first metal subsections and multiple second metal subsections; and the multiple first metal subsections are independently disposed, and adjacent ones of the multiple second metal subsections along the first direction are connected to each other.

20 Claims, 17 Drawing Sheets

(51) Int. Cl.
*H01L 51/52* (2006.01)
*H01L 51/56* (2006.01)
*G06F 3/041* (2006.01)
*G06F 3/044* (2006.01)

(52) U.S. Cl.
CPC ........ *H01L 27/322* (2013.01); *H01L 27/3244* (2013.01); *H01L 51/0023* (2013.01); *H01L 51/5271* (2013.01); *H01L 51/56* (2013.01); *G06F 2203/04103* (2013.01); *H01L 2227/323* (2013.01)

(58) Field of Classification Search
CPC ...... F16C 2326/43; F16C 3/026; F16C 7/026; G06F 3/0412; G06F 3/04164; G06F 3/0446; H01L 2227/323; H01L 27/322; H01L 27/323; H01L 27/3244; H01L 51/0023; H01L 51/5225
See application file for complete search history.

(56) References Cited

U.S. PATENT DOCUMENTS

| | | | |
|---|---|---|---|
| 2016/0179259 A1* | 6/2016 | Watanabe | G06F 3/0445 |
| | | | 345/174 |
| 2018/0026225 A1* | 1/2018 | Kwon | H01L 51/5237 |
| | | | 257/40 |
| 2018/0047946 A1* | 2/2018 | Tsuda | H01L 51/56 |

* cited by examiner

200

DISPLAY PANEL, PREPARATION METHOD THEREOF AND DISPLAY DEVICE

CROSS-REFERENCE TO RELATED APPLICATION

This application claims priority to Chinese Patent Application No. 202011187301.1 filed Oct. 29, 2020, the disclosure of which is incorporated herein by reference in its entirety.

TECHNICAL FIELD

The present disclosure relates to the field of display technologies and, in particular, to a display panel, a preparation method thereof and a display device.

BACKGROUND

A light-emitting diode display panel (such as an OLED display panel, a micro-LED display panel or a mini-LED display panel) does not need a backlight, has advantages such as high brightness, high efficiency, wide viewing angle, lightweight and fast response, and is a research hotspot in the display field.

For a light-emitting diode display panel integrated with a touch function, the touch layer is usually out-cell, that is, the touch substrate is manufactured separately and bonded on the light-outgoing side of the display substrate to form the display panel. In this way, not only is the preparation process relatively complex, but also the thickness of the display panel is increased.

SUMMARY

The present disclosure provides a display panel, a preparation method thereof and a display device so as to reduce the thickness of the display panel and simplify the preparation process.

In a first aspect, the present disclosure provides a display panel, the display panel includes a light-emitting substrate and a color filter substrate which are disposed opposite to each other.

The color filter substrate includes: a base, which comprises a display area; a baffle wall layer located on one side of the base and located in the display area, where the baffle wall layer comprises a plurality of baffle wall structures; and a reflective metal layer, where the reflective metal layer at least comprises a first reflective subsection, and the first reflective subsection covers a surface on a side, close to the light-emitting substrate, of each of the plurality of baffle wall structures. The first reflective subsection comprises a plurality of first metal subsections and a plurality of second metal subsections; on a plane where the first reflective subsection is located, adjacent ones of the plurality of first metal subsections are independently disposed, and adjacent ones of the plurality of second metal subsections along a first direction are connected to each other; and the plurality of first metal subsections are multiplexed as first-type touch electrodes, and the plurality of second metal subsections are multiplexed as second-type touch electrodes. The light-emitting substrate includes an electrode layer on a side, close to the color filter substrate, of the light-emitting substrate, where the electrode layer comprises first electrode subsections and a second electrode subsection which are disposed independently, and adjacent ones of the plurality of first metal subsections along a second direction are electrically connected through at least one first electrode subsection. The first direction and the second direction intersect and are both parallel to the plane where the first reflective subsection is located.

In a second aspect, the present disclosure further provides a preparation method of a display panel. The preparation method is used for preparing the display panel provided in the first aspect and includes steps described below. A color filter substrate and a light-emitting substrate are prepared separately.

The step in which the color film substrate is prepared includes steps described below. A base is provided. The base includes a display area. A baffle wall layer is formed, where the baffle wall layer is located on a side, close to the light-emitting substrate, of the base, and includes multiple baffle wall structures. A reflective metal layer is formed, where the reflective metal layer at least includes a first reflective subsection, and the first reflective subsection covers a surface on a side, close to the light-emitting substrate, of each of the multiple baffle wall structures. The first reflective subsection is etched to form multiple first metal subsections and multiple second metal subsections. On a plane where the first reflective subsection is located, adjacent ones of the multiple first metal subsections are independently disposed, and adjacent ones of the multiple second metal subsections along a first direction are connected to each other. The multiple first metal subsections are multiplexed as first-type touch electrodes, and the multiple second metal subsections are multiplexed as second-type touch electrodes.

The step in which the light-emitting substrate is prepared includes a step described below. An electrode layer is formed, where the electrode layer is located on a side, close to the color filter substrate, of the light-emitting substrate, and the electrode layer includes first electrode subsections and a second electrode subsection which are disposed independently, and adjacent ones of the multiple first metal subsections along a second direction are electrically connected through at least one first electrode subsection; and the first direction and the second direction intersect and are both parallel to the plane where the first metal subsection is located.

In a third aspect, an embodiment of the present disclosure further provides a display device including the display panel provided in the first aspect.

DETAILED DESCRIPTION

Figure 1:
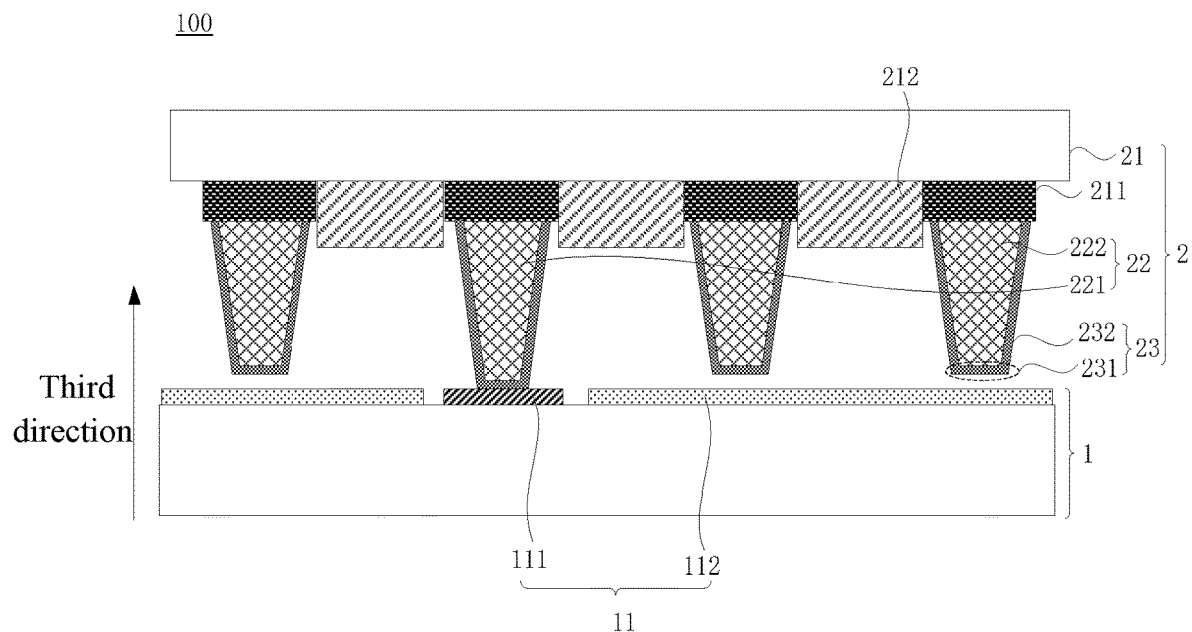
FIG. 1 is a structural view of a display panel provided by an embodiment of the present disclosure.

Hereinafter, the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
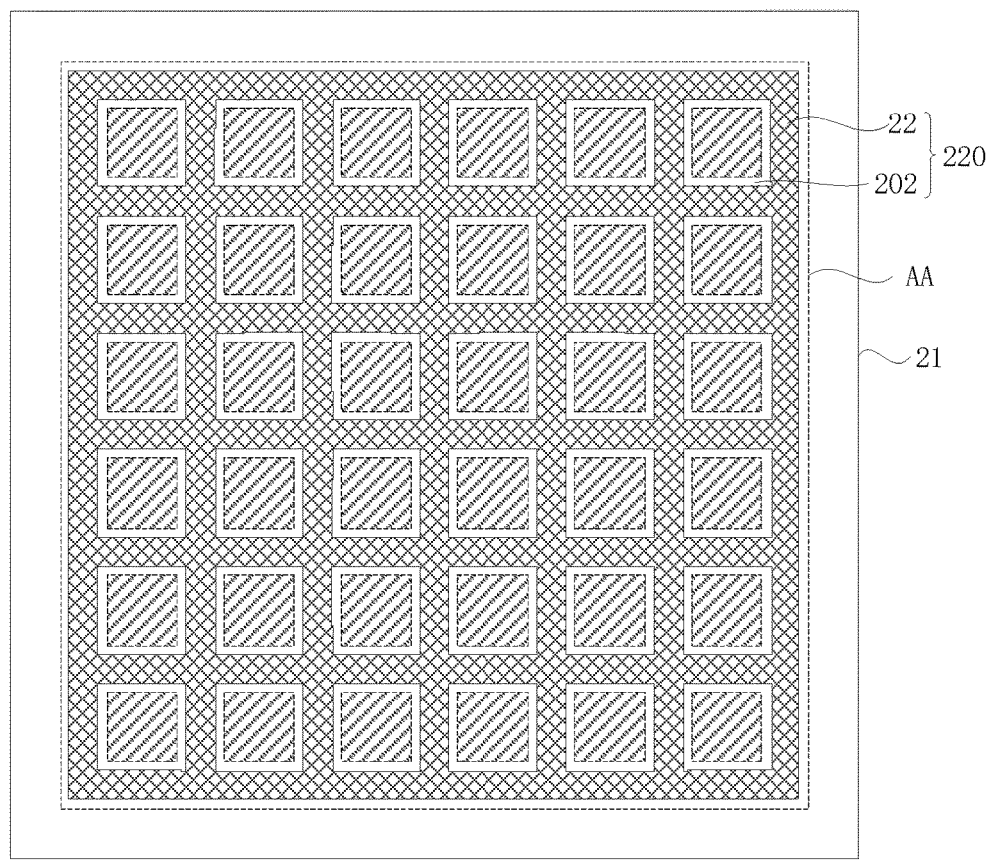
FIG. 2 is a top view of a baffle wall layer provided by an embodiment of the present disclosure.
Figure 3:
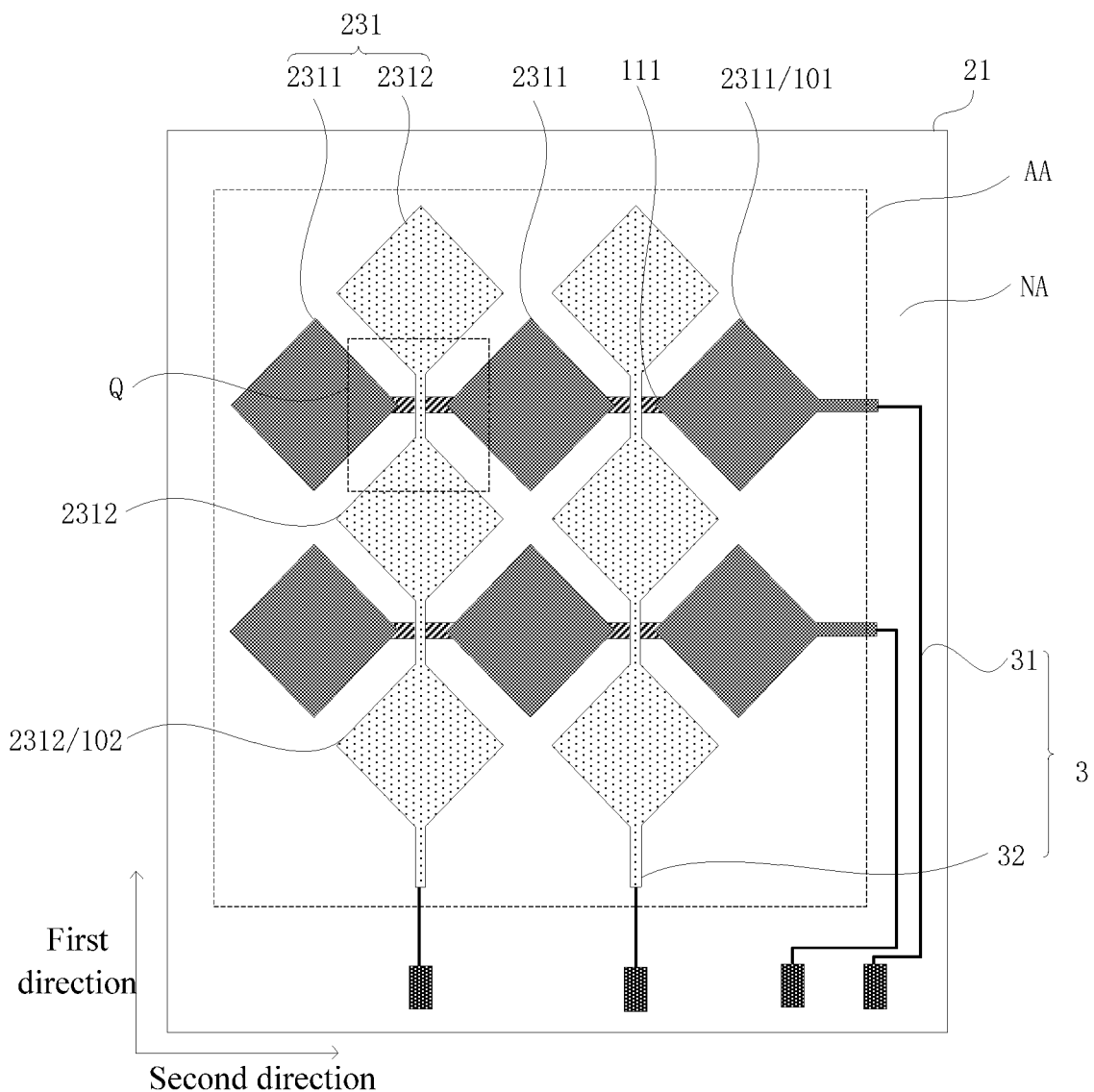
FIG. 3 is a structural view of a touch electrode provided by an embodiment of the present disclosure.

FIG. 1 is a structural view of a display panel provided by an embodiment of the present disclosure. FIG. 2 is a top view of a baffle wall layer provided by an embodiment of the present disclosure. FIG. 3 is a structure view of a touch electrode provided by an embodiment of the present disclosure. Referring to FIGS. 1 and 2, a display panel 100 provided by an embodiment of the present disclosure includes a light-emitting substrate 1 and a color filter substrate 2 which are disposed opposite to each other. The color filter substrate 2 includes a base 21, a baffle wall layer 220 and a reflective metal layer 23. The base 21 includes a display area AA. The baffle wall layer 220 is located on one side of the base 21 and located in the display area AA, where the baffle wall layer 220 includes multiple baffle wall structures 22. The reflective metal layer 23 at least includes a first reflective subsection 231, and the first reflective subsection 231 covers a surface on a side, close to the light-emitting substrate 1, of the multiple baffle wall structures 22. Referring to FIG. 3, the first reflective subsection 231 includes multiple first metal subsections 2311 and multiple second metal subsections 2312; on a plane where the first reflective subsection 231 is located, adjacent ones of the multiple first metal subsections 2311 are independently disposed, and adjacent ones of the multiple second metal subsections 2312 along a first direction are connected to each other; the multiple first metal subsections 2311 are multiplexed as first-type touch electrodes 101, and the multiple second metal subsections are multiplexed as second-type touch electrodes 102. Referring to FIGS. 1 and 3, the light-emitting substrate 1 includes an electrode layer 11 on a side, close to the color filter substrate 2, of the light-emitting substrate 1, where the electrode layer 11 includes first electrode subsections 111 and a second electrode subsection 112 which are disposed independently, and adjacent ones of the multiple first metal subsections 2311 along a second direction are electrically connected through at least one first electrode subsection 111; the first direction and the second direction intersect and are both parallel to the plane where the first reflective subsection 231 is located.

As shown in FIG. 1, the color filter substrate 2 further includes a black matrix 211 and a color resist unit 212. Referring to FIG. 2, each baffle wall structure 22 has a structure similar to a structure of the black matrix and is disposed around the color resist unit. The reflective metal layer 23 is disposed on the multiple baffle wall structures 22 so that baffle light crosstalk between adjacent light-outgoing units in the color filter substrate 2 can be avoided, and at the same time, the reflective metal layer 23 can play a role of reflecting light to prevent the multiple baffle wall structures 22 from absorbing light so as to improve the light-emitting efficiency.

Based on the good conductive characteristic of the reflective metal layer 23, the reflective metal layer covering bottoms of the multiple baffle wall structures 22 may be patterned so that the reflective metal layer 23 can be multiplexed as a touch electrode while preventing the light crosstalk between different light-outgoing units, thereby achieving the purpose of reducing the thickness of the display panel and simplifying the preparation process.

It is to be understood that an original morphology of the reflective metal layer (i.e., the first reflective subsection 231) covering the bottoms of the multiple baffle wall structures 22 is the same as a top morphology of a light-shielding structure (referring to FIG. 2). In the embodiment of the present disclosure, the first reflective subsection 231 is patterned to form multiple first metal subsections 2311 and multiple second metal subsections 2312 (referring to FIG. 3). In this way, the multiple first metal subsections 2311 can be multiplexed as first-type touch electrodes 101 (touch driving electrodes or touch sensing electrodes), and the multiple second metal subsections 2312 can be multiplexed as second-type touch electrodes 102 (touch sensing electrodes or touch driving electrodes), so as to form mutual-capacitive touch electrodes. Since the multiple first metal subsections 2311 and the multiple second metal subsections 2312 are located on a same film layer, and an extension direction of first metal subsections 2311 in each row intersects with an extension direction of second metal subsections 2312 in each column, to enable the first-type touch electrodes 101 and the second-type touch electrodes 102 to independently transmit touch signals, at least one of the first-type touch electrodes 101 or the second-type touch electrodes 102 needs to be independently disposed and adjacent ones of the at least one of the first-type touch electrodes 101 or the second-type touch electrodes 102 are electrically connected by means of another film layer. In the present embodiment, alternatively, the multiple first metal subsections 2311 are disposed independently, and adjacent ones of the multiple second metal subsections 2312 along the first direction are connected to each other, for example, through a part of the first reflective subsection reserved between the adjacent ones of the multiple second metal subsections 2312.

Further, to enable the electric connection between adjacent ones of the multiple first metal subsections 2311 along the second direction, in the embodiment of the present disclosure, the structure of an electrode layer 11 in the light-emitting substrate 1 is improved, that is, the electrode layer 11 is provided as first electrode subsections 111 and a second electrode subsection 112 which are independently disposed, so that adjacent ones of the multiple first metal subsections 2311 along the second direction are electrically connected through at least one first electrode subsection 111. The electrode layer 11 refers to a metal layer that transmits an electrical signal for a light-emitting unit in the light-emitting substrate 1. With such configuration, the electric connection between adjacent ones of the first metal subsections 2311 along the second direction can be achieved without another metal film layer, thereby avoiding the increased thickness the display panel.

Figure 4:
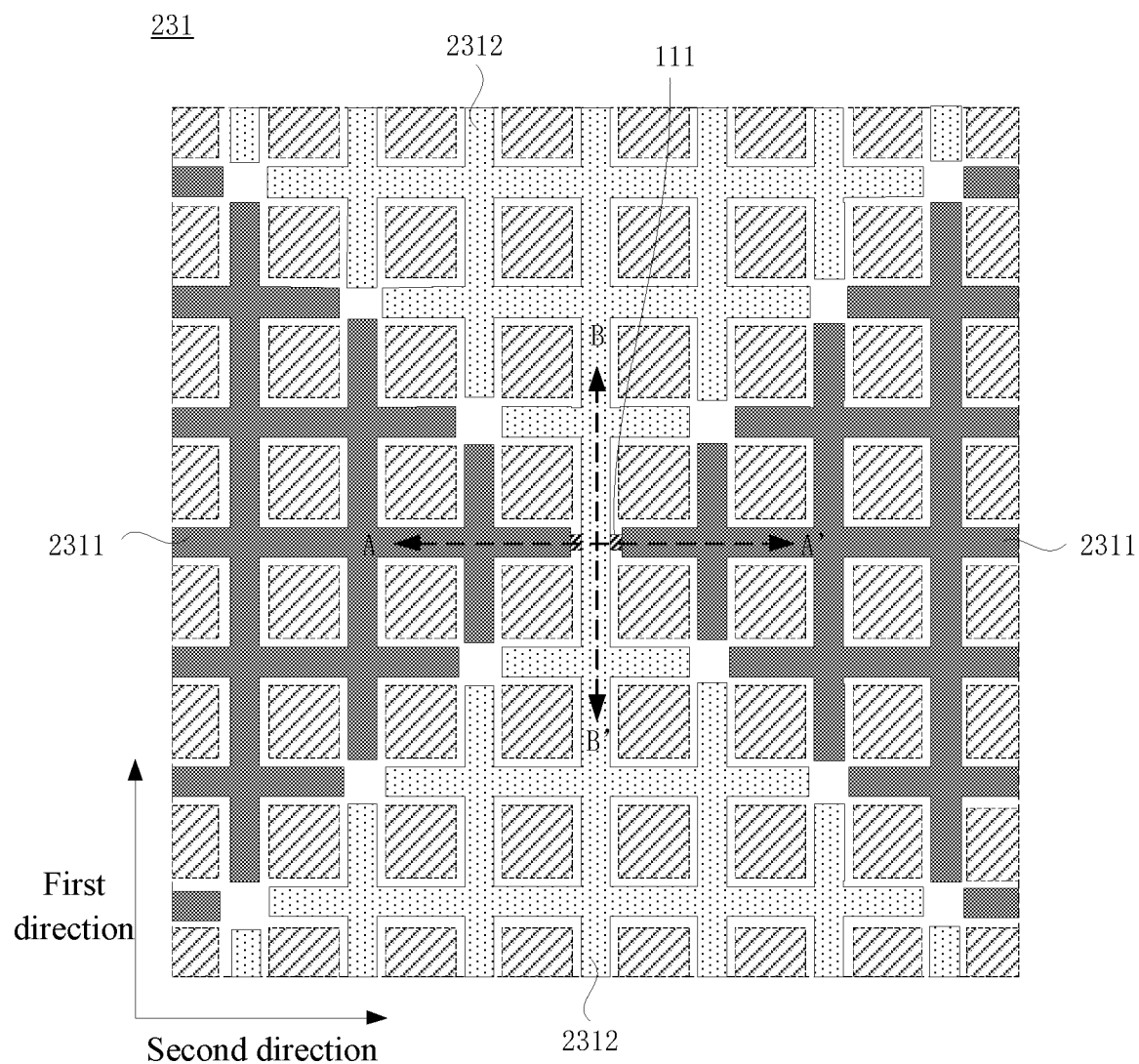
FIG. 4 is an enlarged view of an area Q in FIG. 3.

Exemplarily, FIG. 4 is an enlarged view of an area Q in FIG. 3, and shows a local structure of the patterned first reflective subsection 231. Referring to FIGS. 3 and 4, adjacent ones of the multiple second metal subsections 2312 along the first direction are connected to each other, and adjacent ones of the multiple first metal subsections 2311 along the second direction are electrically connected to each other through at least one first electrode subsection 111, so that the independent transmission of touch signals of the first-type touch electrodes 101 and the second-type touch electrodes 102 is enabled. It is to be noted that in FIGS. 2 and 3, the first metal subsection 2311 and the second metal subsection 2312 are distinguished by different fillings.

It should be noted that a structure of the electrode layer 11 can be determined according to the type of the display panel. Exemplarily, a light-emitting diode provided by the embodiment of the present disclosure may be an organic light-emitting diode (OLED) or an inorganic light-emitting diode, and thus the display panel provided by the present disclosure may be a light-emitting diode (LED) display panel such as an OLED display panel, an LED display panel (the size of the LED is 500 µm or more), a micro-LED display panel (the size of the LED is 100 µm or less) or a mini-LED display panel (the size of the LED is 100 µm to 500 µm). For example, for the OLED display panel, the electrode layer 11 may be a cathode layer; and for the micro-LED display panel or the mini-LED display panel, the electrode layer 11 may be a eutectic layer, which are not limited in the embodiments of the present disclosure and will be described in detail later.

It is to be noted that the color filter substrate 2 in the present embodiment may be a normal color filter substrate 2, the color resist unit of the color filter substrate 2 includes a red color resist, a green color resist, and a blue color resist, and correspondingly, light emitted by the light-emitting unit in the light-emitting substrate 1 may be white light. The color filter substrate 2 may also be a quantum dot color filter substrate, the color resist unit of the color filter substrate 2 is a quantum dot color resist unit, including a red color resist, a green color resist and a scattering color resist, and correspondingly, light emitted by the light-emitting unit in the light-emitting substrate 1 is blue light. Those skilled in the art may design according to requirements, and the type of color filter substrate is not limited in the embodiments of the present disclosure.

In the technical solution of the embodiments of the present disclosure, on one hand, the first reflective subsection, covering surfaces of the baffle wall structures on the side close to the light-emitting substrate, in the color film substrate is divided into multiple first metal subsections and multiple second metal subsections, and adjacent ones of the multiple second metal subsections along the first direction are connected to each other; on the other hand, the electrode layer on the light-emitting substrate is divided into first electrode subsections and a second electrode subsection which are disposed independently, and adjacent ones of the multiple first metal subsections along the second direction are electrically connected to each other through at least one first electrode subsection. In this way, the multiple first metal subsections are multiplexed as first-type touch electrodes, the multiple second metal subsections are multiplexed as second-type touch electrodes, and the independent transmission of touch signals of the first-type touch electrodes and the second-type touch electrodes is enabled. Since this solution does not need to specially prepare the touch substrate and bond the touch substrate to the light-outgoing side of the color filter substrate, the effect of reducing the thickness of the display panel and simplifying the preparation process can be achieved.

On the basis of the above-described embodiment, alternatively, the first metal subsections 2311 are in contact with and electrically connected to the first electrode subsections 111.

When the color filter substrate 2 and the light-emitting substrate 1 are aligned and bonded, the first metal subsections 2311 can be in contact with the first electrode subsections 111 so as to achieve the electrical connection, and the process is simple and efficient.

It is to be understood that it is necessary to ensure that the multiple second metal subsections 2312 are not in contact with the electrode layer 11 (the first electrode subsections 111 or the second electrode subsection 112) while the multiple first metal subsections 2311 are in contact with and electrically connected to the first electrode subsections 111, so as to ensure that the second-type touch electrodes 102 normally transmit the touch signals. Specifically, this purpose can be achieved by improving the structure of the multiple baffle wall structures 22 or the electrode layer 11, such as by raising part of the multiple baffle wall structures 22 or thickening part of the electrode layer 11. First, a method for improving the structure of the multiple baffle wall structures 22 to achieve contact and electrical connection between the multiple first metal subsections 2311 and the first electrode subsections 111 will be described below in detail.

Referring to FIG. 1, alternatively, the multiple baffle wall structures 22 include first-type baffle wall structures 221 and second-type baffle wall structures 222. Each of the multiple first metal subsections 2311 includes a first sub-metal subsection and a second sub-metal subsection, a vertical projection of the first sub-metal subsection on a plane where the base 21 is located overlaps a vertical projection of a respective one of the first-type baffle wall structures 221 on the plane where the base 21 is located, a vertical projection of each of the second-type baffle wall structures 222 on the plane where the base is located overlaps a vertical projection of the second sub-metal subsection of a respective one of the plurality of first metal subsections 2311 and a vertical projection of a respective one of the plurality of second metal subsections 2312 on the plane where the substrate is located; and along a third direction, a height of each of the first-type baffle wall structures 221 is greater than a height of each of second-type baffle wall structures 222, and the third direction is parallel to a light-outgoing direction of the display panel.

It is to be understood that the first metal subsections 2311 being in contact with and electrically connected to the first electrode subsections 111 may refer to that each of the first metal subsections 2311 is entirely in contact with and electrically connected to at least one first electrode subsection 111, or a part of each of the first metal subsections 2311 is in contact with and electrically connected to at least one first electrode subsection 111. Alternatively, this embodiment uses a solution in which a part of each of the first metal subsections 2311 (i.e., a first sub-metal subsection) is in contact with and electrically connected to the at least one first electrode subsection 111, so that it can be achieved that the first metal subsections 2311 are in contact with and electrically connected to the first electrode subsections 111, and the arrangement area or signal transmission of the second electrode subsection 112 is prevented from being affected by a large size of the first electrode subsections 111.

Specifically, in this embodiment, the multiple baffle wall structures 22 are provided as the first-type baffle wall structures 221 and the second-type baffle wall structures 222 with different heights, where the height of each first-type baffle wall structure 221 is greater than the height of each second-type baffle wall structure 222, so that a first sub-metal subsection, which covers a respective first-type baffle wall structure 221, in each of the first metal subsections 2311 can be in contact with the at least one first electrode subsection 111, and adjacent ones of the multiple first metal subsections 2311 along the second direction are electrically connected through at least one first electrode subsection 111. Since the multiple second metal subsections 2312 cover the second-type baffle wall structures 222, it can be ensured that the multiple second metal subsections 2312 are not in contact with the electrode layer 11, thereby ensuring the independent transmission of the touch signals.

Figure 5:
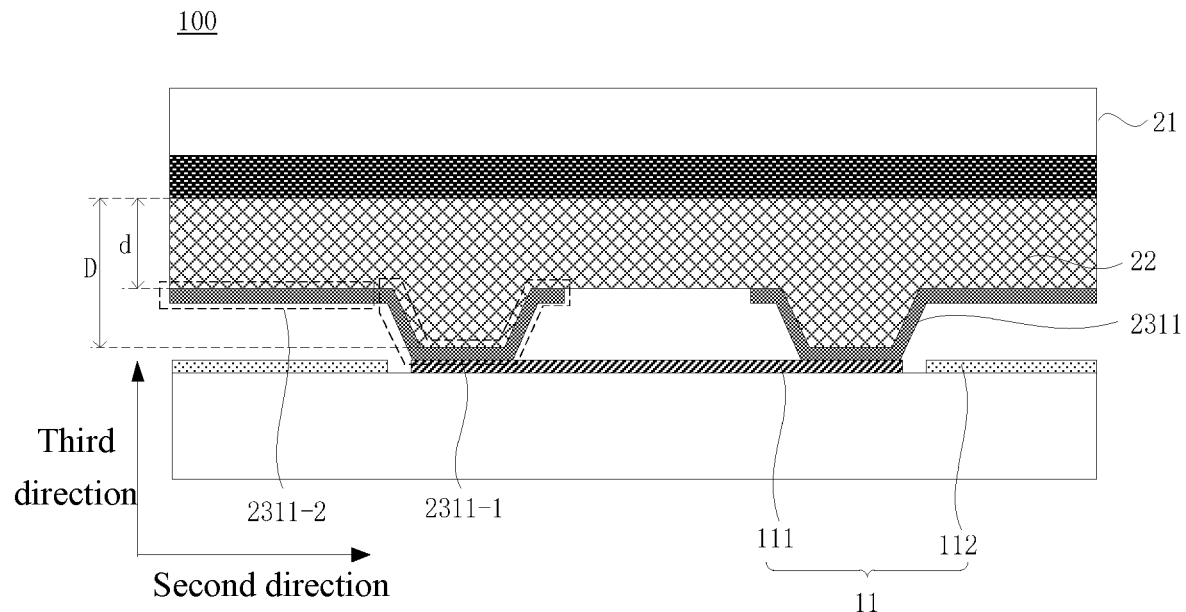
FIG. 5 is a sectional view of a display panel taken along AA' in FIG. 4.

Exemplarily, FIG. 5 is a sectional view of a display panel taken along AA' in FIG. 4. Referring to FIG. 5, further alternatively, at least one of a first end of each first metal subsection 2311 or a second end of each first metal subsection 2311 is provided with a first sub-metal subsection 2311-1, and the first end is opposite to the second end in the second direction.

As shown in FIG. 5, the first sub-metal subsection 2311-1 is disposed at one end of the each first metal subsection 2311 along the second direction, and the remaining part of the each first metal subsection 2311 is a second sub-metal subsection 2311-2. Along a third direction, a height D of the first-type baffle wall structure 221 corresponding to the first sub-metal subsection 2311-1 is greater than a height d of the second-type baffle wall structure 222 corresponding to the second sub-metal subsection 2311-2, thereby achieving that the first metal subsections 2311 are in contact with and electrically connected to the first electrode subsections 111 and adjacent ones of the multiple first metal subsections 2311 along the second direction are electrically connected through at least one first electrode subsection 111.

It is to be understood that in a first metal subsection 2311, adjacent to a boundary of the display area AA, of the multiple first metal subsections 2311, the first sub-metal subsection 2311-1 is located at the first end or the second end of the first metal subsection 2311, and in the other first metal subsections 2311 of the multiple first metal subsections 2311, the first sub-metal subsection 2311-1 is located at the first end and the second end of each of the other first metal subsections 2311.

Figure 6:
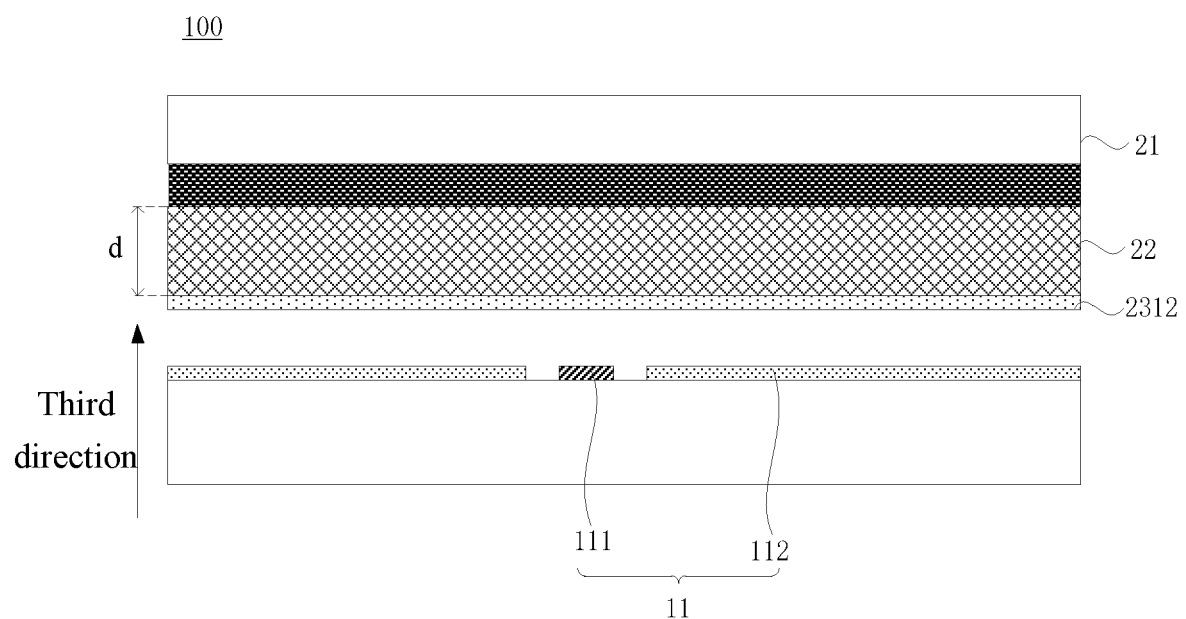
FIG. 6 is a sectional view of a display panel taken along BB' in FIG. 4.

FIG. 6 is a sectional view of a display panel taken along BB' in FIG. 4. It can be seen from FIG. 6, the height d of the second-type baffle wall structure 222 corresponding to the second metal subsection 2312 is small, so that the second metal subsection 2312 is not in contact with the electrode layer 11, and thus the independent transmission of the touch signals is ensured.

Figure 7:
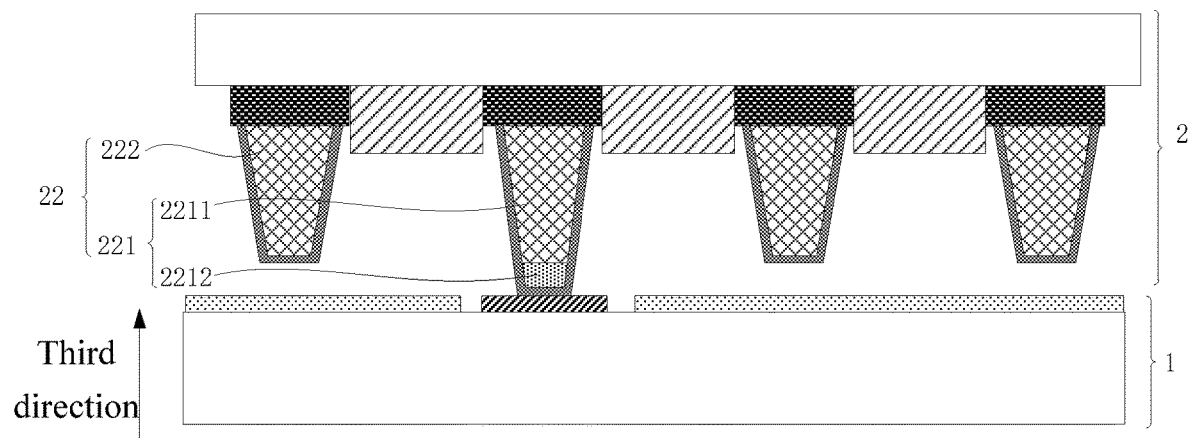
FIG. 7 is a structural view of another display panel provided by an embodiment of the present disclosure.
Figure 8:
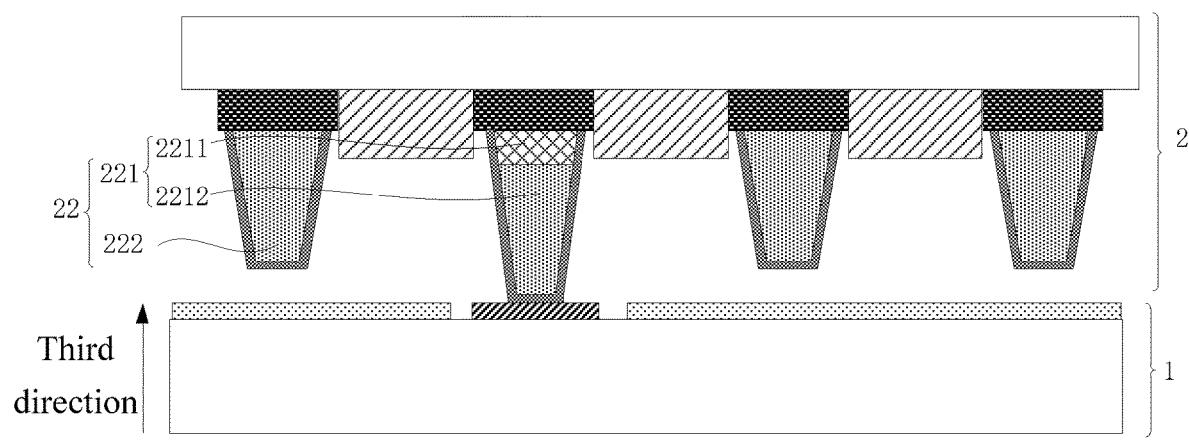
FIG. 8 is a structural view of another display panel provided by an embodiment of the present disclosure.

FIG. 7 is a structural view of another display panel provided by an embodiment of the present disclosure. FIG. 8 is a structural view of another display panel provided by an embodiment of the present disclosure. Referring to FIGS. 7 and 8, alternatively, each first-type baffle wall structure 221 includes a first sub-baffle-wall structure 2211 and a second sub-baffle-wall structure 2212 laminated in the third direction; and each second-type baffle wall structure 222 is disposed in a same layer and has a same height as the first sub-baffle-wall structure 2211 (FIG. 7), or each second-type baffle wall structure 222 is disposed in a same layer and has a same height as the second sub-baffle-wall structure 2212 (FIG. 8).

It is to be understood that usually all baffle wall structures are of the same height in the third direction so that it is impossible to achieve that only the first metal subsections 2311 are in contact with and electrically connected to the first electrode subsections 111. In this embodiment, the second sub-baffle-wall structure 2212 is added to a surface of a side, close to the light-emitting substrate 1, of the first sub-baffle-wall structure 2211 (FIG. 7), or the first sub-baffle-wall structure 2211 is added between the second sub-baffle-wall structure 2212 and a respective black matrix (FIG. 8), so as to enable the height of each first-type baffle wall structure 221 to be greater than the height of each second-type baffle wall structure 222, so that the first metal subsections 2311 are in contact with and electrically connected to the first electrode subsections 111.

It is to be noted that in FIGS. 7 and 8, the second-type baffle wall structure 222 using different fillings is just used for indicating that the second-type baffle wall structure 222 is disposed in the same layer and has the same height as the first sub-baffle-wall structure 2211 and the second sub-baffle-wall structure 2212.

In summary, the solution for improving the structure of the multiple baffle wall structures 22 to implement the contact and electrical connection between the first metal subsections 2311 and the first electrode subsections 111 is described in detail in the above embodiment. A method for improving the structure of the electrode layer 11 to implement the contact and electrical connection between the first metal subsections 2311 and the first electrode subsection 111 is described below in detail.

As described above, the structure of the electrode layer 11 can be determined according to the type of the display panel, and here improvement of the structure of the electrode layer 11 based on different types of display panels will be described in detail.

Figure 9:
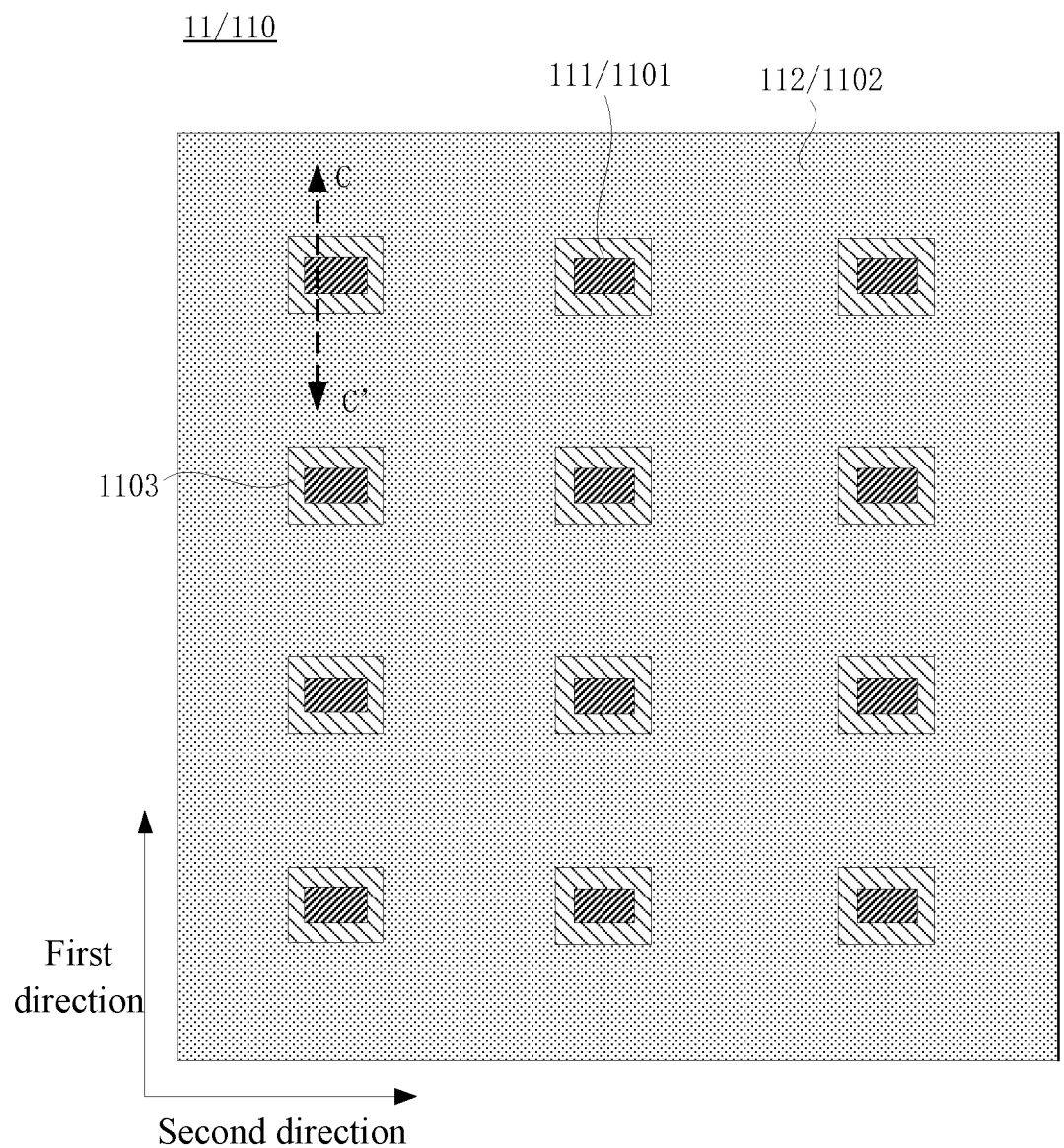
FIG. 9 is a top view of a cathode layer provided by an embodiment of the present disclosure.

First, the display panel may be, for example, an organic light-emitting diode (OLED) display panel, and the electrode layer may be a cathode layer. Exemplarily, FIG. 9 is a top view of a cathode layer provided by an embodiment of the present disclosure. Referring to FIG. 9, alternatively, the light-emitting substrate includes a light-emitting diode light-emitting substrate. The light-emitting diode light-emitting substrate includes the cathode layer 110, and the cathode layer 110 is multiplexed as the electrode layer 11.

For the OLED display panel, the cathode layer 110 is usually an entire layer. The cathode layer 110 is patterned so that the cathode layer 110 is multiplexed as the electrode layer 11 including the first electrode subsections 111 and the second electrode subsection 112 which are disposed independently. In a case where all baffle wall structures have the same height, the structure of the cathode layer 110 can be improved by using the following solution so that the multiple first metal subsections 2311 are in contact with and electrically connected to the first electrode subsections 111.

Figure 10:
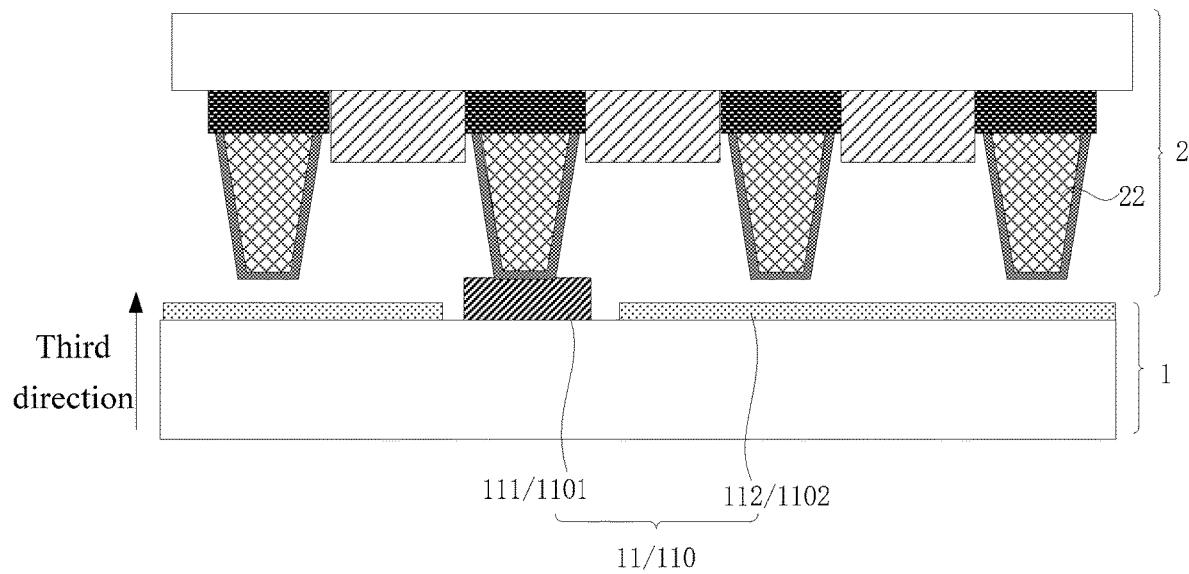
FIG. 10 is a sectional view of a display panel taken along CC' in FIG. 9.

FIG. 10 is a sectional view of a display panel taken along CC' in FIG. 9. Referring to FIGS. 9 and 10, alternatively, the cathode layer 110 includes a first cathode subsection 1101 and a second cathode subsection 1102 which are disposed independently, adjacent ones of the multiple first metal subsections 2311 along the second direction are electrically connected through the first cathode subsection 1101, and the second cathode subsection 1102 serves as a common cathode for multiple light-emitting diodes in the light-emitting diode light-emitting substrate; along a third direction, a thickness of the first cathode subsection 1101 is greater than a thickness of the second cathode subsection 1102, and the third direction is parallel to a light-outgoing direction of the display panel.

As shown in FIG. 10, in this embodiment, the cathode layer 110 is patterned into the first cathode subsection 1101 and the second cathode subsection 1102, and the thickness of the first cathode subsection 1101 is greater than the thickness of the second cathode subsection 1102, thereby achieving that the first metal subsections 2311 are in contact with and electrically connected to the first cathode subsection 1101, and ensuring that the second metal subsections 2312 are not in contact with the cathode layer 110.

In summary, for the OLED display panel, the contact and electrical connection between the first metal subsections 2311 and the first cathode subsections 1101 (the first electrode subsections 111) can be achieved by at least one of the following: the height of each of a part of the multiple baffle wall structures 22 is raised; or the thickness of a part of the cathode layer 110 is increased, which is not limited by the embodiments of the present disclosure.

Figure 11:
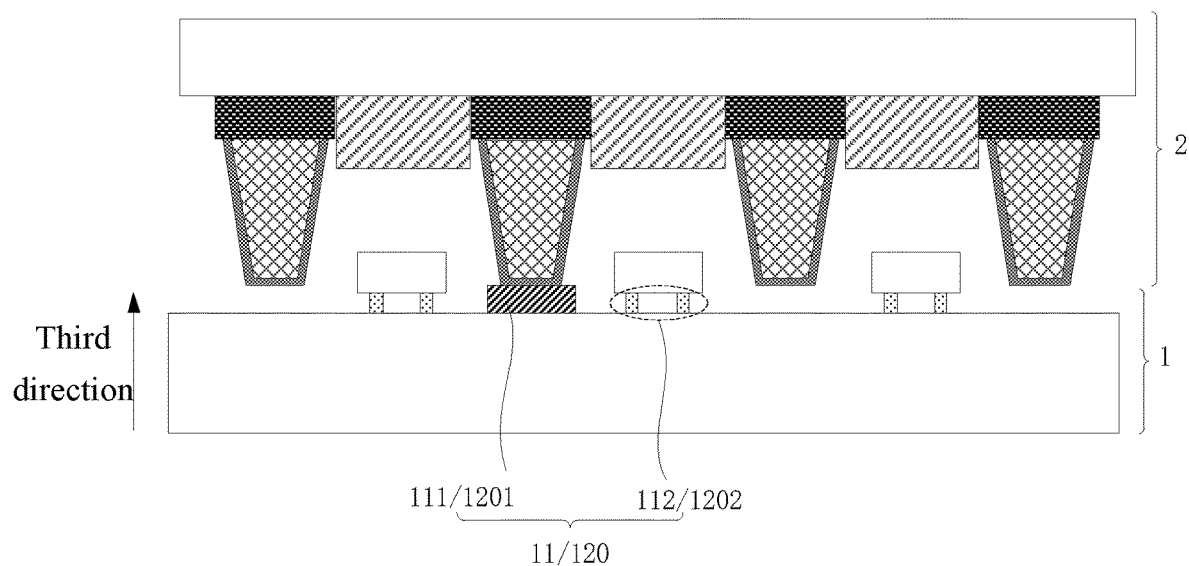
FIG. 11 is a structural view of another display panel provided by an embodiment of the present disclosure.

In addition, the display panel may also be a micro-LED display panel or a mini-LED display panel. Exemplarily, FIG. 11 is a structural view of another display panel provided by an embodiment of the present disclosure. Referring to FIG. 11, alternatively, the light-emitting substrate 1 includes a light-emitting diode light-emitting substrate. The light-emitting diode light-emitting substrate includes a eutectic layer 120, and the eutectic layer 120 is multiplexed as the electrode layer 11; and the eutectic layer 120 includes a first eutectic subsection 1201 and a second eutectic subsection 1202, adjacent ones of the multiple first metal subsections 2311 along the second direction are both in contact with and electrically connected to the first eutectic subsection 1201, and the second eutectic subsection 1202 serves as a eutectic electrode of multiple light-emitting diodes in the light-emitting diode light-emitting substrate.

For the micro-LED display panel or the mini-LED display panel, the eutectic layer 120 usually refers to the eutectic electrode of the micro-LED or mini-LED, that is, the eutectic layer 120 usually just includes the second eutectic subsection 1202. In this embodiment, the first eutectic subsection 1201 is added so that adjacent ones of the multiple first metal subsections 2311 along the second direction are both in contact with and electrically connected to the first eutectic subsection 1201, thereby achieving that the adjacent ones of the multiple first metal subsections 2311 along the second direction are electrically connected through the first eutectic subsection 1201.

It is to be noted that, along the third direction, a thickness of the first eutectic subsection 1201 and a thickness of the second eutectic subsection 1202 may be the same or different, which is not limited in the embodiments of the present disclosure, as long as the first metal subsection 2311 is in contact with and electrically connected to the first eutectic subsection 1201.

Figure 12:
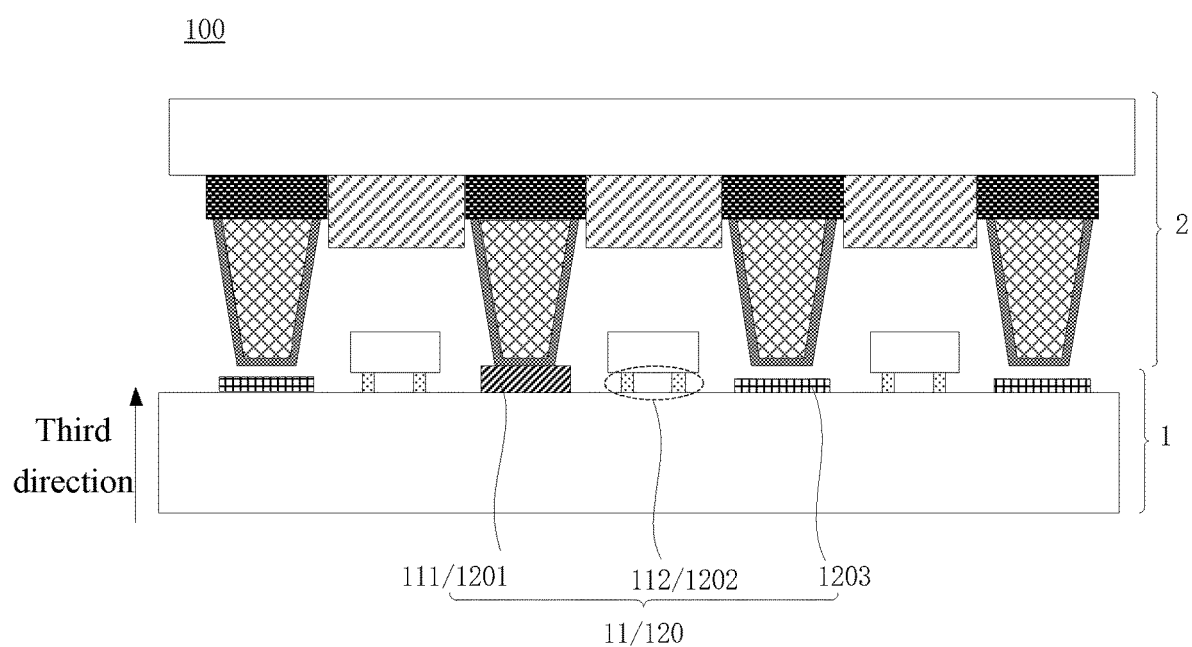
FIG. 12 is a structural view of another display panel provided by an embodiment of the present disclosure.

Further, FIG. 12 is a structural view of another display panel provided by an embodiment of the present disclosure. Referring to FIG. 12, alternatively, the eutectic layer 120 further includes a third eutectic section 1203, a vertical projection of the third eutectic subsection 1203 on a plane where the base 21 is located overlaps vertical projections of the second metal subsections 2312 and a part of each first metal subsection 2311 on the plane where the base 21 is located; and along a third direction, a thickness of the third eutectic subsection 1203 is less than a thickness of the first eutectic subsection 1201, and the third direction is parallel to a light-outgoing direction of the display panel.

It can be seen from FIG. 11, in a case where the first eutectic subsection 1201 is disposed corresponding to only a part of each first metal subsection 2311, there is a gap between the bottom of the remaining part of the first reflective subsection 231 and the light-emitting substrate 1, causing the effect of the reflective metal layer on preventing the light crosstalk and reflecting light to be limited. In this embodiment, the third eutectic subsection 1203 is added so that the effect of preventing the light crosstalk and reflecting light can be further improved. Meanwhile, since the thickness of the third eutectic subsection 1203 is smaller than the thickness of the first eutectic subsection 1201 it can be ensured that the second metal subsections 2312 are not in contact with the third eutectic subsection 1203 and the independent transmission of the touch signals is achieved.

In summary, for the micro-LED display panel or the mini-LED display panel, the first eutectic subsection 1201 needs to be added. It is to be understood that the contact and electrical connection between the first metal subsections 2311 and the first eutectic subsections 1201 (the first electrode subsections 111) can be achieved by adjusting at least one of the height of each of a part of the multiple baffle wall structures 22 or the thickness of the first eutectic subsection 1201, which is not limited by the embodiment of the present disclosure.

In summary, at least one of the structure of the baffle wall structures 22 or the structure of the electrode layer 11 is improved so that the contact and electrical connection between the multiple first metal subsections 2311 and the first electrode subsections 111 can be achieved. Those skilled in the art can choose the implementation solution according to the actual situations, which is not limited by the embodiments of the present disclosure.

On the basis of the above-described embodiments, a structure of the display panel is further described below in detail.

Figure 13:
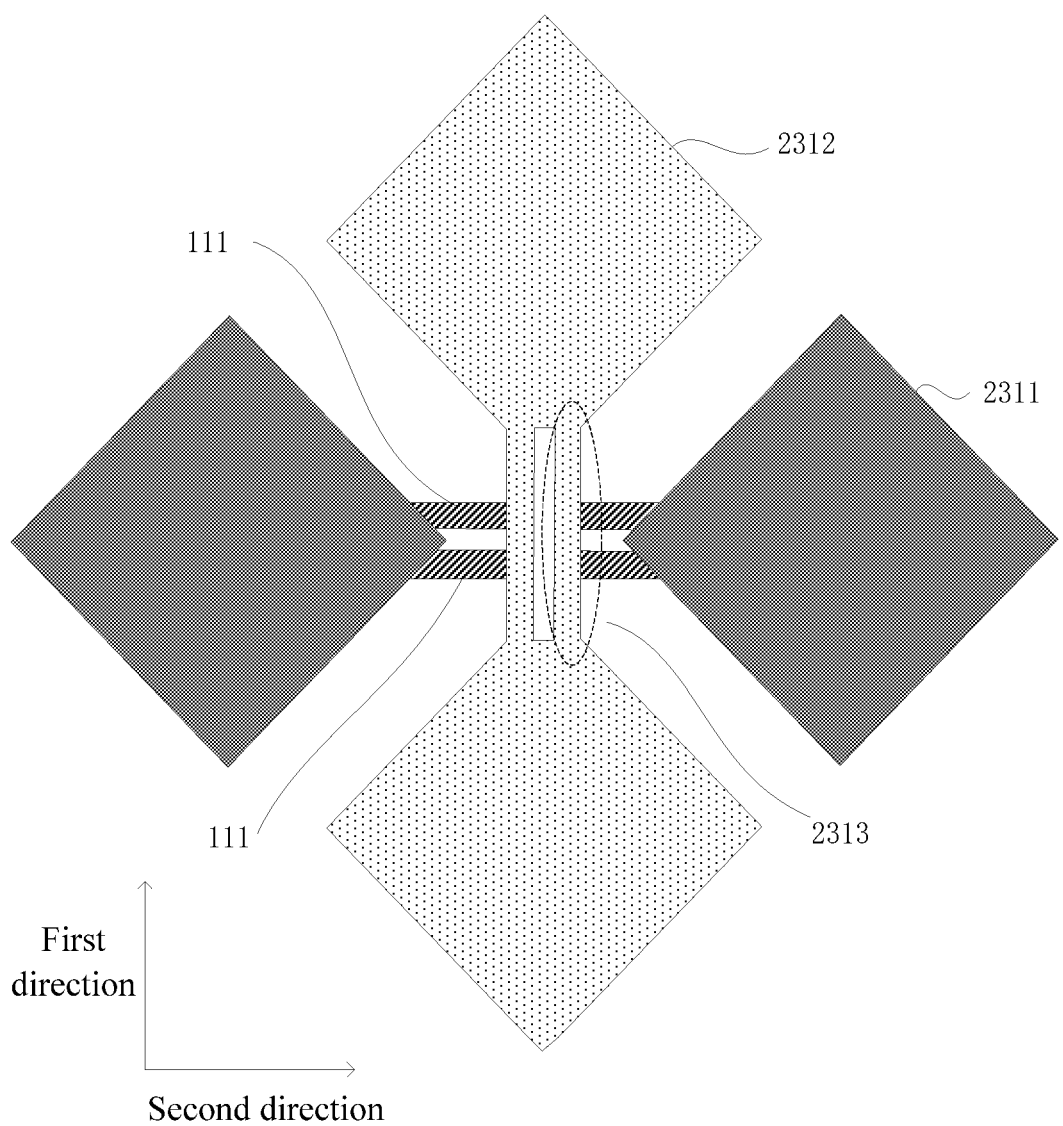
FIG. 13 is a structural view of another touch electrode provided by an embodiment of the present disclosure.

FIG. 13 is a structural view of another touch electrode provided by an embodiment of the present disclosure. Referring to FIG. 13, alternatively, any two first metal subsections 2311 adjacent along the second direction are electrically connected through at least two first electrode subsections 111.

Such arrangement ensures that in a case where one or more of the at least two first electrode subsections 111 is in poor contact with the two first metal subsections 2311 adjacent along the second direction, the electric connection between the two first metal subsections 2311 adjacent along the second direction can be achieved by another one of the at least two first electrode subsections 111, thus ensuring the quality of the display panel.

Referring to FIG. 13, alternatively, adjacent ones of the multiple second metal subsections 2312 along the first direction are electrically connected to each other by at least one connection portion 2313, and the at least one connection portion 2313 is disposed in a same layer as the first reflective subsection 231.

FIG. 13 illustrates an example in which adjacent ones of the multiple second metal subsections 2312 along the first direction are electrically connected to each other by two connection portions 2313. Similarly, in a case where the number of the connection portions 2313 between the adjacent ones of the multiple second metal subsections 2312 along the first direction increases, the reliability of the electrical connection between the adjacent second metal subsections 2312 can also be ensured. For the multiple second metal subsections 2312, since the connection portions 2313 are in a same layer as the first reflective subsection 231 or the second metal subsections 2312, the possibility of disconnection is small. Those skilled in the art may design as required, as long as the adjacent ones of the multiple second metal subsections 2312 along the first direction are electrically connected to each other by at least one connection portion 2313.

Alternatively, the light-emitting substrate further includes a filling structure located between each of the first electrode subsections and the second electrode subsection; and a dielectric constant of the filling structure is less than a dielectric constant of air.

The filling structure is disposed between each of the first electrode subsection 111 and the second electrode subsection 112, and the dielectric constant of the filling structure is smaller than the dielectric constant of the air, so that a decoupling effect can be achieved, and a parasitic capacitance, which influences the transmission of the touch signals and the light-emitting control signals, between the first electrode subsection 111 and the second electrode subsection 112 can be avoided.

Exemplarily, referring to FIG. 9, using an example in which the cathode layer 110 is multiplexed as the electrode layer 11, the first cathode subsections 1101 serve as the first electrode subsections 111, the second cathode subsection 1102 serves as the second electrode subsection 112, and the filling structure 1103 is provided between each of the first cathode subsection 1101 and the second cathode subsection 1102, thereby achieving the decoupling effect.

Alternatively, a resistivity of each of the first electrode subsections 111 is less than a resistivity of the second electrode subsection 112.

It is to be understood that the first electrode subsections 111 are used for transmitting the touch signals and the second electrode subsection 112 is used for transmitting the light-emitting control signals. The touch sensing signals may be very weak, and the resistivity of the first electrode section 111 is provided to be less than the resistivity of the second electrode subsection 112 so that it can be ensured that the conductivity of each of the first electrode subsection 111 is good, which facilitates the transmission of the touch signals and improves the detection accuracy of the touch position.

Referring to FIG. 3, alternatively, the base 21 further includes a non-display area NA; the display panel further includes a touch electrode trace 3 disposed in the non-display area NA; and the touch electrode trace 3 includes a first-type touch electrode trace 31 and a second-type touch electrode trace 32, where the first-type touch electrode trace 31 is electrically connected to the first-type touch electrodes 101, and the second-type touch electrode trace 32 is electrically connected to the second-type touch electrodes 102.

The first-type touch electrode trace 31 and the second-type touch electrode trace 32 are to guide the first-type touch electrodes 101 and the second-type touch electrode traces 32 respectively from the display area AA to the non-display area NA, thereby achieving the transmission of the touch signals.

Alternatively, the first-type touch electrode trace 31 and the second-type touch electrode trace 32 are disposed on a same layer as the first reflective subsection 231.

In this embodiment, the first-type touch electrode trace 31 and the second-type touch electrode trace 32 are disposed on the same layer as the first reflective subsection 231, and the first-type touch electrode trace 31, the second-type touch electrode trace 32, the first metal subsections 2311 and the second metal subsections 2312 can be formed in a same process, so that the process is simpler and more efficient.

Referring to FIG. 2, alternatively, the baffle wall layer 220 also includes multiple baffle wall openings 202, and each of the multiple baffle wall openings 202 is disposed between adjacent ones of the multiple baffle wall structures 22; and the reflective metal layer 23 further includes a second reflective subsection 232, and the second reflective subsection 232 covers a surface on a side, close to the multiple baffle wall openings 202, of each of the multiple baffle wall structures 22.

The multiple baffle wall openings 202 are used for light emitted from the light-emitting units in the light-emitting substrate 1 to pass through. The second reflective subsection 232 represents a reflective metal layer located on sidewalls of the baffle wall structures 22, and plays a role of preventing light crosstalk between adjacent light-emitting units in the color filter substrate and reflecting the light to prevent the baffle wall structure 22 from absorbing the light.

Alternatively, the first-type touch electrodes 101 are touch driving electrodes and the second-type touch electrodes 102 are touch sensing electrodes; alternatively, the first-type touch electrodes 101 are touch sensing electrodes and the second-type touch electrodes 102 are touch driving electrodes, which can be set by those skilled in the art and is not limited by the embodiments of the present invention.

Figure 14:
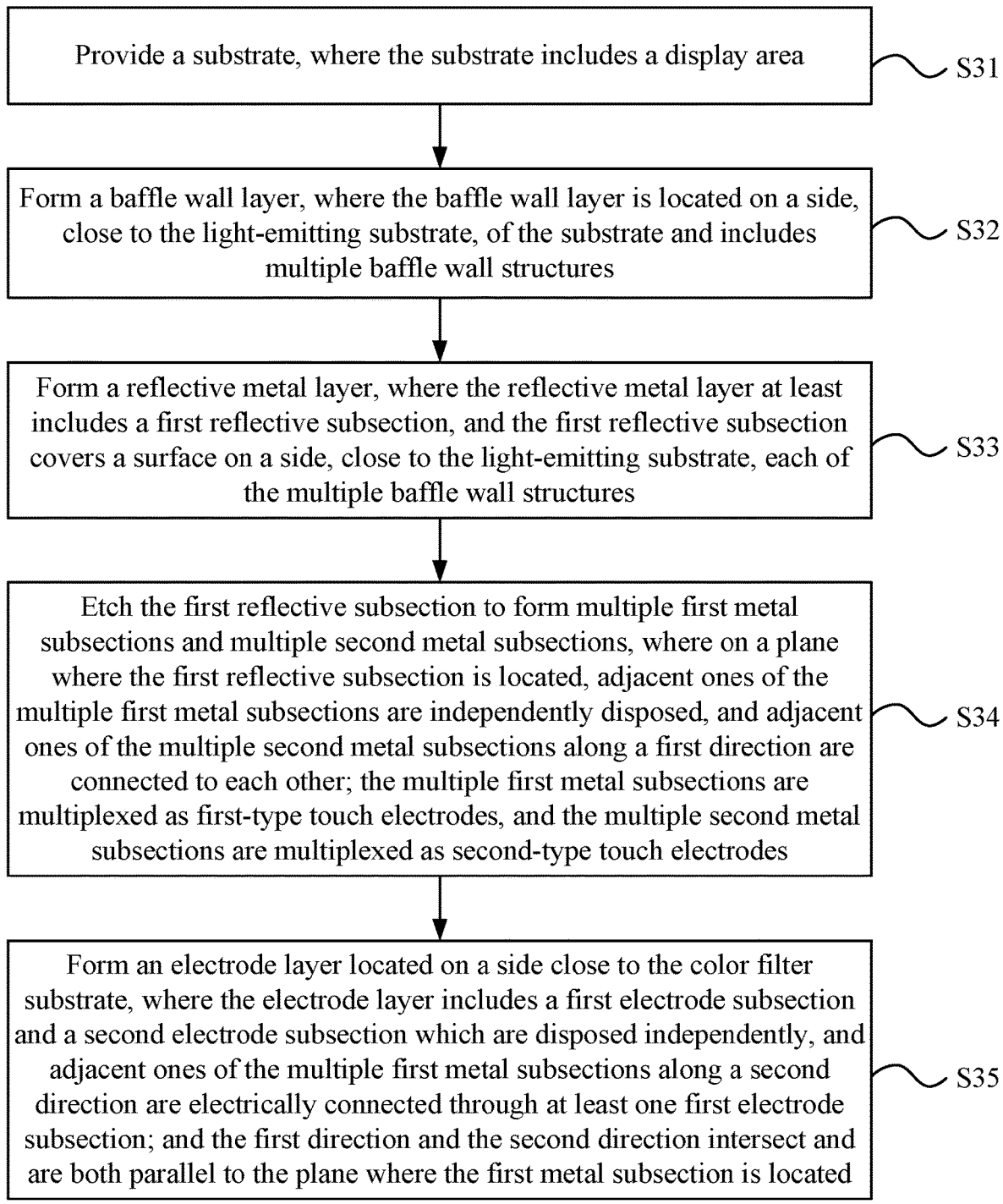
FIG. 14 is a flowchart of a preparation method of a display panel provided by an embodiment of the present disclosure.
Figure 15:
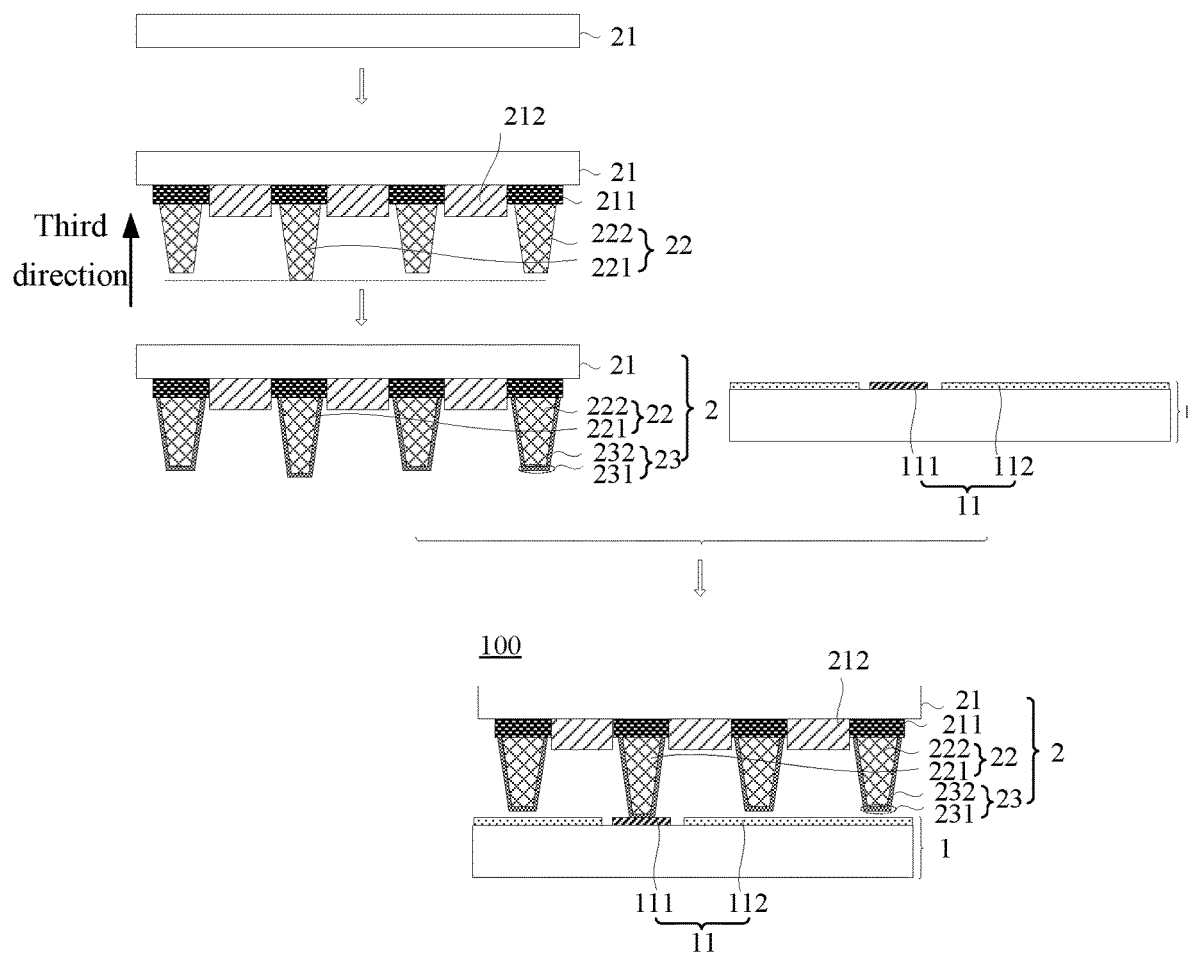
FIG. 15 is a preparation flowchart of a display panel corresponding to the preparation method shown in FIG. 14.

An embodiment of the present disclosure further provides a preparation method for a display panel, which is used for preparing the display panel according to any one of the embodiments described above. FIG. 14 is a flowchart of a preparation method of a display panel provided by an embodiment of the present disclosure. FIG. 15 is a preparation flowchart of a display panel corresponding to the preparation method shown in FIG. 14. In FIG. 15, reference numeral 100 denotes a display panel, 2 denotes a color filter substrate, 1 denotes a light-emitting substrate, 21 denotes a base, 211 denotes a black matrix, 212 denotes a color resist unit, 22 denotes a baffle wall structure, 23 denotes a reflective metal layer, 231 denotes a first reflective subsection, 232 denotes a second reflective subsection, 11 denotes an electrode layer, 111 denotes a first electrode subsection, and 112 denotes a second electrode subsection. Referring to FIGS. 14 and 15, the preparation method for the display panel includes preparing a color filter substrate and a light-emitting substrate separately. The step of preparing the color film substrate includes the steps described below.

In S31, a base is provided. The base includes a display area.

In S32, a baffle wall layer is formed, where the baffle wall layer is located on a side, close to the light-emitting substrate, of the base, and includes multiple baffle wall structures.

Reference may be made to FIG. 2 for the structure of the baffle wall layer. In addition to the multiple baffle wall structures 22, the baffle wall layer 220 also includes a baffle wall opening 202 disposed between adjacent ones of the multiple baffle wall structures 22.

In S33, a reflective metal layer is formed, where the reflective metal layer at least includes a first reflective subsection, and the first reflective subsection covers a surface on a side, close to the light-emitting substrate, each of the multiple baffle wall structures.

Specifically, referring to FIG. 1, the reflective metal layer 23 includes a first reflective subsection 231 and a second reflective subsection 232, and the first reflective subsection 231 covers a bottom of each of the multiple baffle wall structures 22, and the second reflective subsection 232 covers a sidewall of each of the multiple baffle wall structures 22.

In S34, the first reflective subsection is etched to form multiple first metal subsections and multiple second metal subsections. On a plane where the first reflective subsection is located, adjacent ones of the multiple first metal subsections are independently disposed, and adjacent ones of the multiple second metal subsections along a first direction are connected to each other; the multiple first metal subsections are multiplexed as first-type touch electrodes, and the multiple second metal subsections are multiplexed as second-type touch electrodes.

Figure 16:
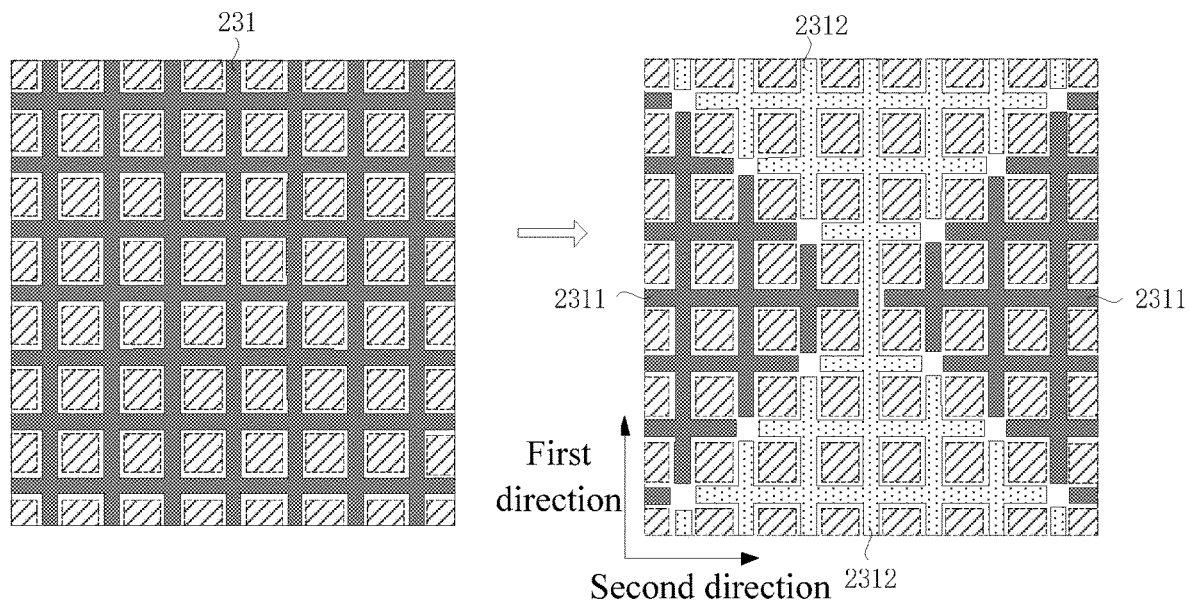
FIG. 16 is a structural view showing a comparison of structures of the first reflective subsection before and after being etched provided by the embodiment of the present disclosure.

FIG. 16 is a structural view showing a comparison of structures of the first reflective subsection before and after being etched provided by the embodiment of the present disclosure. Referring to FIG. 16, the first reflective subsection 231 is etched to form multiple first metal subsections 2311 and multiple second metal subsections 2312. In this way, the multiple first metal subsections 2311 can be multiplexed as the first-type touch electrodes (touch driving electrodes or touch sensing electrodes), and the multiple second metal subsections 2312 can be multiplexed as the second-type touch electrodes (touch driving electrodes or touch sensing electrodes), so as to form mutual-capacitive touch electrodes.

At the same time of etching the first reflective subsection 231 to form the multiple first metal subsections 2311 and the multiple second metal subsections 2312, the first-type touch electrode trace 31 and the second-type touch electrode trace 32 may also be formed in order to simplify the preparation process and improve the preparation efficiency.

The step in which the light-emitting substrate is prepared includes a step described below.

In S35, an electrode layer is formed, the electrode layer is located on a side close to the color filter substrate, where the electrode layer includes first electrode subsections and a second electrode subsection which are disposed independently, and adjacent ones of the multiple first metal subsections along a second direction are electrically connected through at least one first electrode subsection; the first direction and the second direction intersect and are both parallel to the plane where the first metal subsection is located.

The formation of the electrode layer may be determined according to the type of the display panel, which will be described later in detail and is not repeated here.

It is to be noted that the order of S35 and S31 to S34 is not limited, and FIG. 14 is merely illustrative. Specifically, as shown in FIG. 15, after the color filter substrate 2 and the light-emitting substrate 1 are prepared, the color filter substrate 2 and the light-emitting substrate 1 are aligned and bonded so that adjacent ones of the multiple first metal subsections 2311 along the second direction are electrically connected through at least one first electrode subsection 111.

In the preparation method of the display panel provided by the embodiment of the present disclosure, on one hand, at the time of preparing the color filter substrate, the first reflective subsection covering the bottoms of the multiple baffle wall structures is etched to form multiple first metal subsections and multiple second metal subsections, and adjacent ones of the multiple second metal subsections along a first direction are connected; on the other hand, at the time of preparing the color filter substrate, the electrode layer, including the first electrode subsections and the second electrode subsection which are disposed independently, is formed, and adjacent ones of the multiple first metal subsections along the second direction are electrically connected to each other through at least one first electrode subsection, so that the first metal subsections are multiplexed as the first-type touch electrodes and the second metal subsections are multiplexed as the second-type touch electrode, thereby achieving the independent transmission of touch signals of the first-type touch electrode and the second-type touch electrode. Since the preparation method does not need to specially prepare the touch substrate and bond the touch substrate to the light-outgoing side of the display substrate, the preparation method has the advantages of simple preparation process and high preparation efficiency, and thus the thickness of the display panel prepared by this method can be greatly reduced.

As described above in the embodiment of the display panel, alternatively, the first metal subsections 2311 are in contact with and electrically connected to the first electrode subsections 111. This purpose can be achieved by improving at least one of the structure of the baffle wall structures 22 or the structure of the electrode layer 11. Hereinafter, the preparation method for the multiple baffle wall structures and the preparation method for the electrode layer will be described separately below in detail.

For the solution of improving the multiple baffle wall structures, alternatively, the multiple baffle wall structures include first-type baffle wall structures and second-type baffle wall structures. Each first metal subsection includes a first sub-metal subsection and a second sub-metal subsection, a vertical projection of the first sub-metal subsection on a plane where the base is located overlaps a vertical projection of a respective one of the first-type baffle wall structures on the plane where the base is located, and a vertical projection of each of the second-type baffle wall structures on the plane where the base is located overlaps a vertical projection of the second sub-metal subsection of a respective one of the plurality of first metal subsections and a vertical projection of a respective one of the plurality of second metal subsections on the plane where the substrate is located. To form the first-type baffle wall structures and second-type baffle wall structures, the following two preparation methods may be used.

Figure 17:
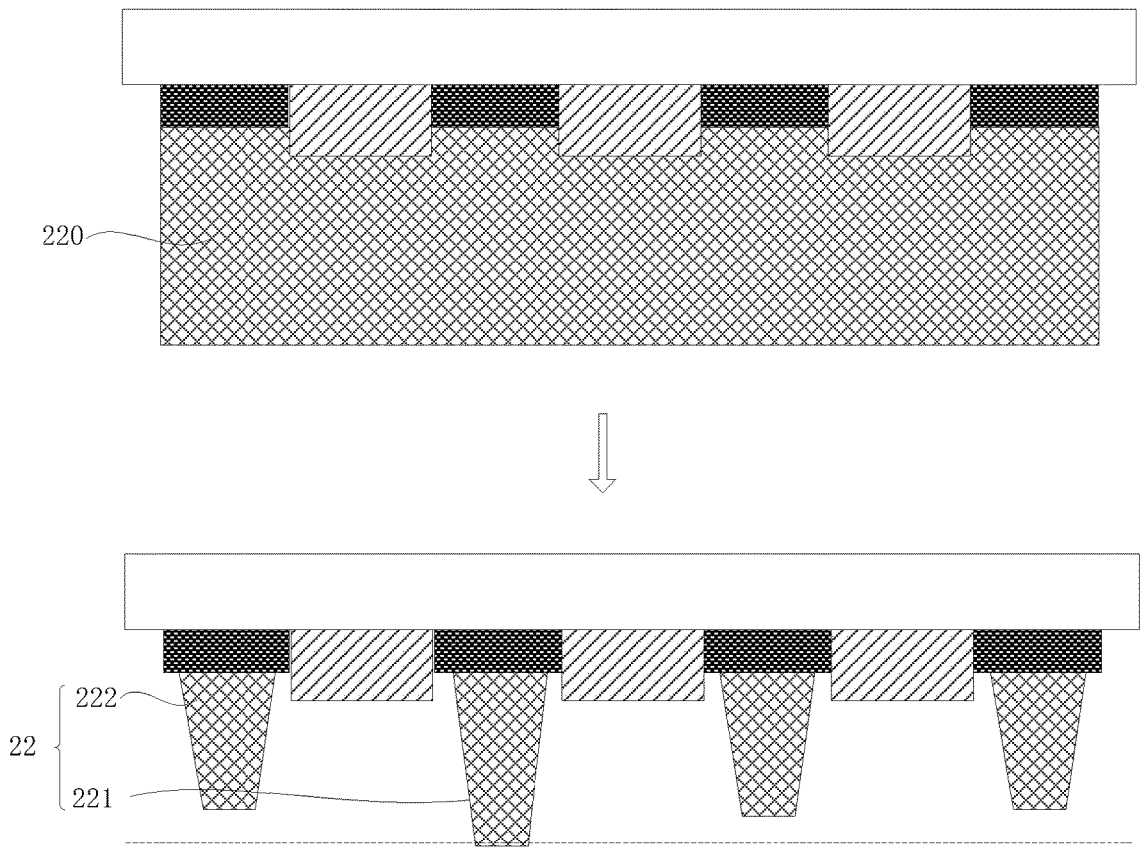
FIG. 17 is a preparation flowchart of forming a baffle wall structure provided by an embodiment of the present disclosure.

In the first preparation method, a half-tone process is used. FIG. 17 is a preparation flowchart of forming a baffle wall structure provided by an embodiment of the present disclosure. In FIG. 17, reference numeral 22 denotes a baffle wall structure, 221 denotes a first-type baffle wall structure, and 222 denotes a second-type baffle wall structure. Referring to FIG. 17, the step in which the baffle wall structure is formed includes: forming first-type baffle wall structures and second-type baffle wall structures by using a half-tone process, where along a third direction, a height of each of the first-type baffle wall structures is greater than a height of each of second-type baffle wall structures, and the third direction is parallel to a light-outgoing direction of the display panel.

In this embodiment, the half-tone process is used so that original baffle wall structures with a same height can be formed into the first-type baffle wall structures and second-type baffle wall structures with different heights in one mask process, and the preparation method is simple and efficient.

In the second preparation method, a process of multiple times of coating etching is used. This solution may be prepared by using two different processes.

Figure 18:
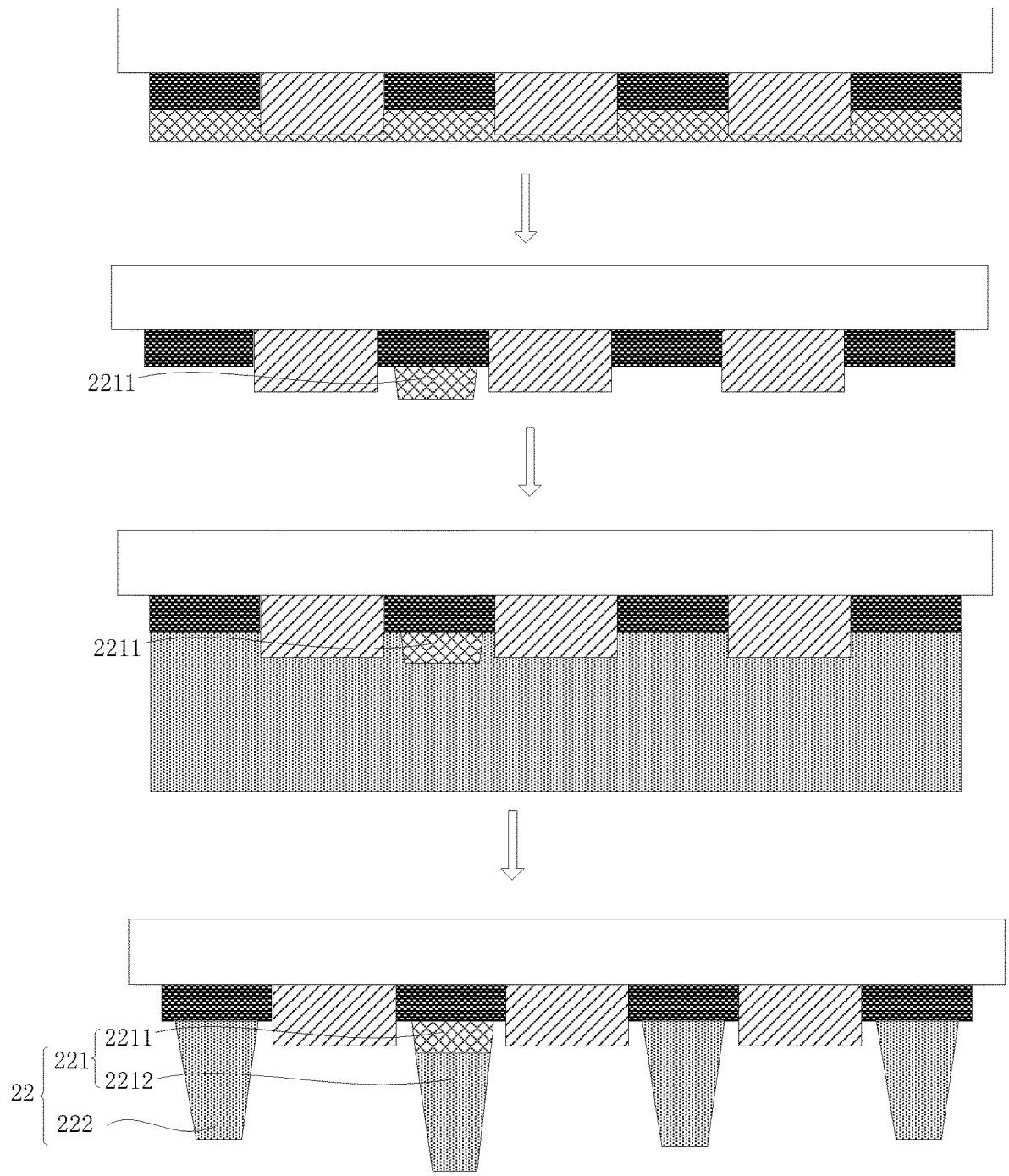
FIG. 18 is another preparation flowchart of forming a baffle wall structure provided by an embodiment of the present disclosure.

In one process, exemplarily, FIG. 18 is another preparation flowchart of forming a baffle wall structure provided by an embodiment of the present disclosure. In FIG. 18, reference numeral 22 denotes a baffle wall structure, 2211 denotes a first sub-baffle-wall structure, 2212 denotes a second sub-baffle-wall structure, and 222 denotes a second-type baffle wall structure. Referring to FIG. 18, the steps in which the baffle wall structures is formed include: forming a first sub-baffle-wall structure of each of the first-type baffle wall structures by using a first mask process; and forming each of the second-type baffle wall structures and a second sub-baffle-wall structure of each of the first-type baffle wall structures by using a second mask process, where the second sub-baffle-wall structure is located on a side, close to the light-emitting substrate, of the first sub-baffle-wall structure, and the second-type baffle wall structures are disposed on a same layer and have a same height as the second sub-baffle-wall structures.

Figure 19:
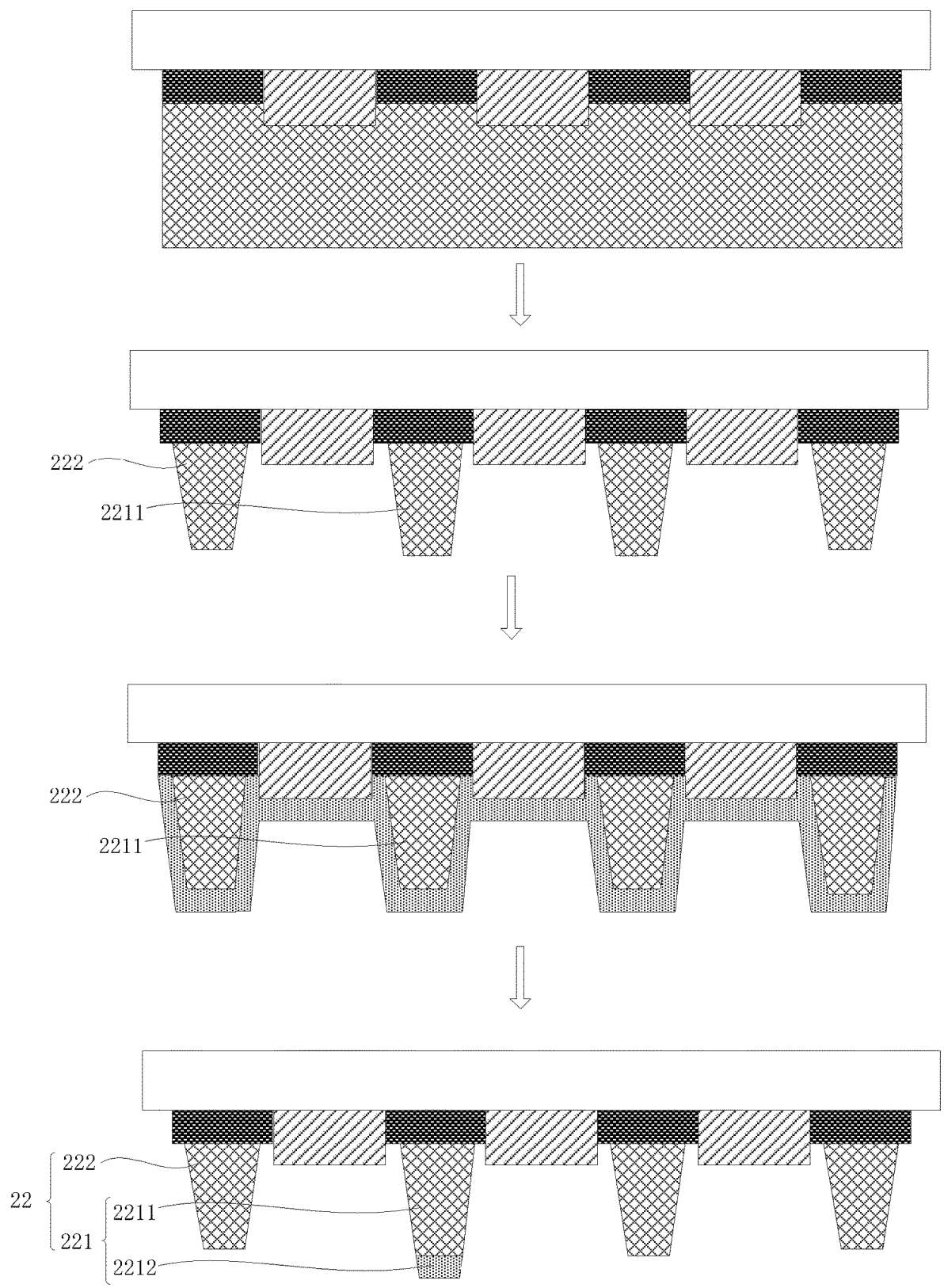
FIG. 19 is another preparation flowchart of forming a baffle wall structure provided by an embodiment of the present disclosure.

In another process, exemplarily, FIG. 19 is another preparation flowchart of forming a baffle wall structure provided by an embodiment of the present disclosure. In FIG. 19, reference numeral 22 denotes a baffle wall structure, 2211 denotes a first sub-baffle-wall structure, 2212 denotes a second sub-baffle-wall structure, and 222 denotes a second-type baffle wall structure.

Referring to FIG. 19, the steps in which the baffle wall structures is formed include: forming each of the second-type baffle wall structures and a first sub-baffle-wall structure of each of the first-type baffle wall structures by using the first mask process, where the second-type baffle wall structures are disposed on a same layer and have a same height as the first sub-baffle-wall structure; and forming a second sub-baffle-wall structure of each of the first-type baffle wall structures by using the second mask process, where the second sub-baffle-wall structure is located on a side, close to the light-emitting substrate, of the first sub-baffle-wall structure.

In this embodiment, through a twice-mask process (i.e., two times of coating and two times of etching), the first-type baffle wall structures and the second-type baffle wall structures with different heights are formed, the processes are more mature, and requirements for an etching device are lower. Those skilled in the art may adopt the half-tone process or the twice-mask process to form the first-type baffle wall structures and the second-type baffle wall structures according to actual situations, which is not limited in the embodiments of the present disclosure.

In summary, the above-described embodiment has described the preparation method for the baffle wall structures in detail, and the preparation method for the electrode layer is described below in detail. Here, the preparation method for the electrode layer is also described based on the type of the display panel.

Figure 20:
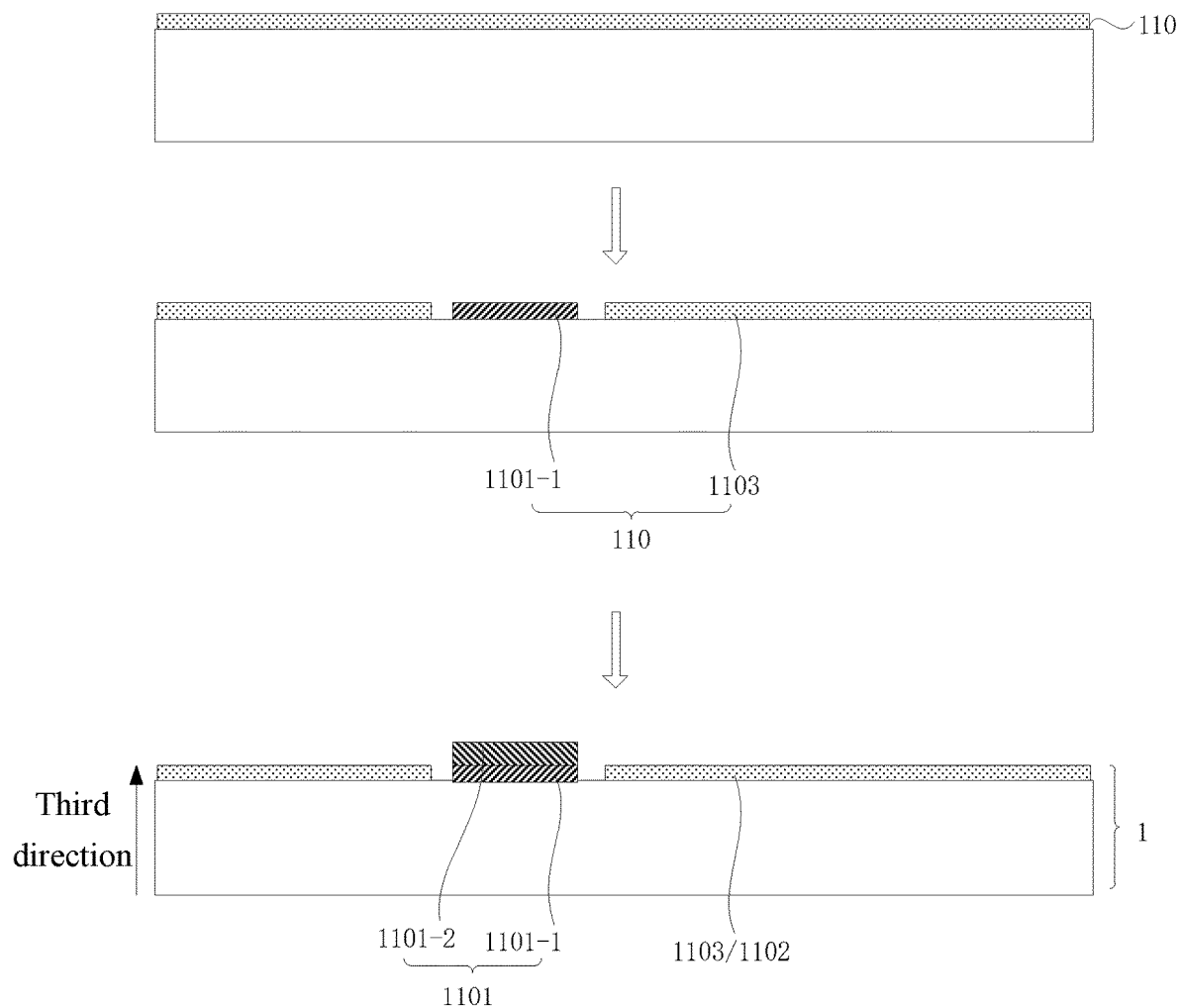
FIG. 20 is a preparation flowchart of forming an electrode layer provided by an embodiment of the present disclosure.

Firstly, a preparation process of the electrode layer is introduced by using an OLED display panel as an example. FIG. 20 is a preparation flowchart of forming an electrode layer provided by an embodiment of the present disclosure. In FIG. 20, reference numeral 1 denotes a light-emitting substrate, 110 denotes a cathode layer, 1101-1 denotes a first cathode structure, 1103 denotes a second cathode structure, 1101-2 denotes a cathode additional structure, 1101 denotes a first cathode subsection, and 1102 denotes a second cathode subsection. Referring to FIG. 20, the light-emitting substrate includes the light-emitting diode light-emitting substrate, and the steps of forming the electrode layer including the first electrode subsections and the second electrode subsection which are disposed independently include: forming a cathode layer; etching the cathode layer to obtain a first cathode structure and a second cathode structure which are disposed independently, where along a third direction, a thickness of the first cathode structure is same as the second cathode structure, and the third direction is parallel to the light-outgoing direction of the display panel; preparing a cathode additional structure on a side of the first cathode structure, where along the third direction, the cathode additional structure and the first cathode structure are laminated to obtain a first cathode subsection, and the second cathode structure is a second cathode subsection; along the third direction, a thickness of the first cathode subsection is greater than a thickness of the second cathode subsection; adjacent ones of the multiple first metal subsections along the second direction are both in contact with and electrically connected to the first cathode subsection, and the second cathode subsection serves as a common cathode for multiple light-emitting diodes in the light-emitting diode light-emitting substrate.

Referring to FIG. 20, in this embodiment, the solution in which the cathode additional structure 1101-2 is formed on the first cathode structure 1101-1 to obtain the first cathode subsection 1101 not only ensures that the thickness of the first cathode subsection 1101 is greater than the thickness of the second cathode subsection 1102, but also avoids waste of materials. At the same time, the cathode additional structure 101-2 may also be configured as a material having a small resistivity, thereby ensuring good conductivity of the first cathode subsection 1101 (the first electrode subsection), which facilitates the transmission of the touch signals and improves the detection accuracy of the touch position.

Figure 21:
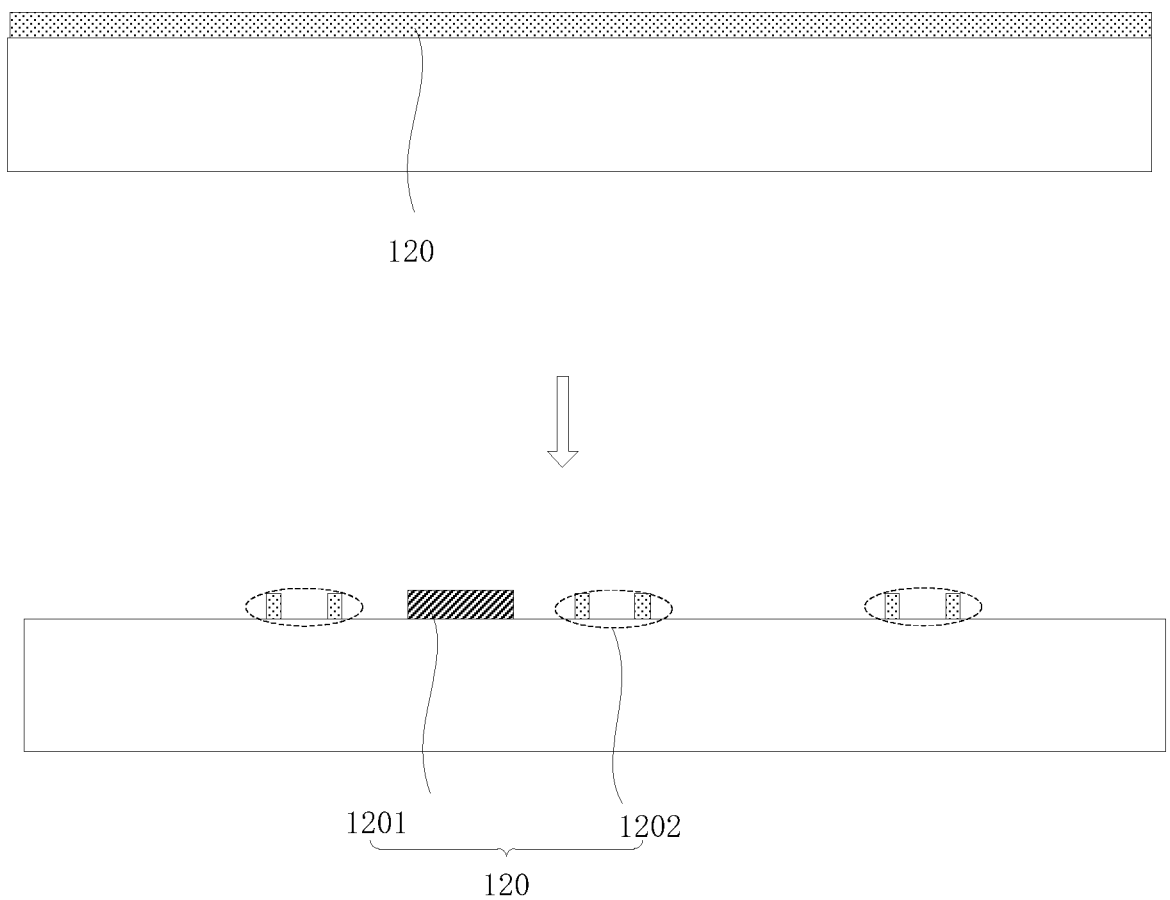
FIG. 21 is another preparation flowchart of forming an electrode layer provided by an embodiment of the present disclosure.

Next, the preparation process of the electrode layer is described by using the micro-LED display panel or the mini-LED display panel as an example. FIG. 21 is another preparation flowchart of forming an electrode layer provided by an embodiment of the present disclosure. In FIG. 21, reference numeral 120 denotes a eutectic layer, 1201 denotes a first eutectic subsection, and 1202 denotes a second eutectic subsection. Referring to FIG. 21, the light-emitting substrate includes the light-emitting diode light-emitting substrate, and the steps of forming the electrode layer including the first electrode subsections and the second electrode subsection which are disposed independently include: forming a eutectic layer; and etching the eutectic layer to obtain a first eutectic subsection and a second eutectic subsection, where adjacent ones of the multiple first metal subsections along the second direction are both in contact with and electrically connected to the first eutectic subsection, and the second eutectic subsection serves as an eutectic electrode of multiple light-emitting diodes in the light-emitting diode light-emitting substrate.

Referring to FIG. 21, in this embodiment, the eutectic layer 120 is etched to obtain the first eutectic subsection 1201 and the second eutectic subsection 1202 which are disposed independently, so that adjacent ones of the first metal subsections along the second direction are electrically connected through the first eutectic subsection 1201, and the second eutectic subsection 1202 may be used for transmitting the light-emitting control signals for the light-emitting diodes (such as the micro-LED or the mini-LED), and the preparation method is simple and efficient.

In addition, the eutectic layer may also be etched to obtain a third eutectic subsection (referring to FIG. 12). Exemplarily, the first eutectic subsection and the third eutectic subsection with different heights may be obtained by using the half-tone process or the twice-mask process, which will not be described here in detail.

On the basis of the above-described embodiment, the preparation method may further include: preparing a filling structure between each of the first electrode subsection and the second electrode subsection, where a dielectric constant of the filling structure is less than a dielectric constant of air (referring to FIG. 9) so as to reduce coupling between the first electrode subsections and the second electrode subsection, and ensure the independent transmission of the touch signals and the light-emitting control signals. The method for preparing the filling structure is not limited in the embodiment of the present disclosure.

Figure 22:
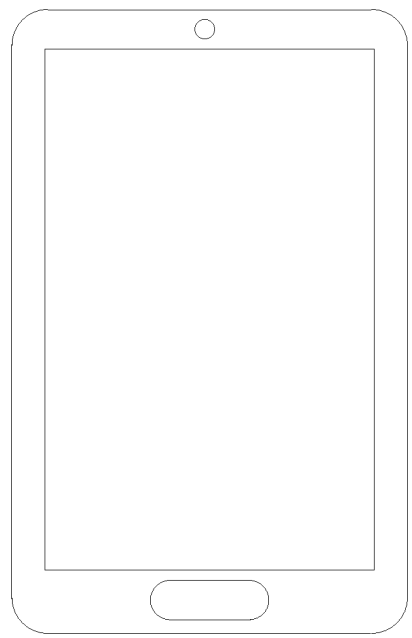
FIG. 22 is a structural view of a display device provided by an embodiment of the present disclosure.

Based on the same concept, the embodiment of the present disclosure also provides a display device. FIG. 22 is a structural view of a display device provided by an embodiment of the present disclosure. The display device 200 includes the display panel 100 of any of the above embodiments, thereby having the same beneficial effects as the above display panel; similarities may be understood with reference to the above description of the display panel and will not be described here. The display device 200 provided by the embodiment of the present disclosure may be a phone shown in FIG. 22, or may be any electronic product with display function, including but not limited to the following categories: television, laptop, desktop display, tablet computer, digital camera, smart bracelet, smart glasses, vehicle-mounted display, medical equipment, industrial control equipment, touch interactive terminal, etc., and no special limitations are made thereto in the embodiments of the present disclosure.

It is to be noted that the above are merely the preferred embodiments of the present disclosure and the technical principles used therein. It is to be understood by those skilled in the art that the present disclosure is not limited to the particular embodiments described herein. Those skilled in the art can make various apparent modifications, adaptations and substitutions without departing from the scope of the present disclosure. Therefore, though the present disclosure has been described in detail through the embodiments described above, the present disclosure is not limited to the embodiments described above and may include other equivalent embodiments without departing from the concept of the present disclosure. The scope of the present disclosure is determined by the scope of the appended claims.

What is claimed is:

1. A display panel, comprising: a light-emitting substrate and a color filter substrate which are disposed opposite to each other,
    wherein the color filter substrate comprises:
    a base, which comprises a display area;
    a baffle wall layer located on one side of the base and located in the display area, wherein the baffle wall layer comprises a plurality of baffle wall structures; and
    a reflective metal layer, wherein the reflective metal layer at least comprises a first reflective subsection, and the first reflective subsection covers a surface of each of at least one of the plurality of baffle wall structures, the surface being at a side of the each of the at least one of the plurality of baffle wall structures facing the light-emitting substrate,
    wherein the first reflective subsection comprises a plurality of first metal subsections and a plurality of second metal subsections; on a plane where the first reflective subsection is located, adjacent ones of the plurality of first metal subsections are independently disposed, and adjacent ones of the plurality of second metal subsections along a first direction are connected to each other; and the plurality of first metal subsections are multiplexed as first-type touch electrodes, and the plurality of second metal subsections are multiplexed as second-type touch electrodes; and
    the light-emitting substrate comprises:
    a plurality of light-emitting diodes and an electrode layer, wherein the electrode layer is disposed on a side, close to the color filter substrate, of the light-emitting substrate, wherein the reflective metal layer is located between the baffle wall layer and the electrode layer, wherein the electrode layer comprises first electrode subsections and a second electrode subsection which are disposed independently, and adjacent ones of the plurality of first metal subsections along a second direction are electrically connected to each other through at least one first electrode subsection; and the first direction and the second direction intersect and are both parallel to the plane where the first reflective subsection is located.

2. The display panel of claim 1, wherein the plurality of first metal subsections are in contact with and electrically connected to the first electrode subsections.

3. The display panel of claim 2, wherein the plurality of baffle wall structures comprise first-type baffle wall structures and second-type baffle wall structures;
    each of the plurality of first metal subsections comprises a first sub-metal subsection and a second sub-metal subsection, a vertical projection of the first sub-metal subsection on a plane where the base is located overlaps a vertical projection of a respective one of the first-type baffle wall structures on the plane where the base is located, a vertical projection of each of the second-type baffle wall structures on the plane where the base is located overlaps a vertical projection of the second sub-metal subsection of a respective one of the plurality of first metal subsections and a vertical projection of a respective one of the plurality of second metal subsections on the plane where the substrate is located; and
    along a third direction, a height of each of the first-type baffle wall structures is greater than a height of each of the second-type baffle wall structures, and the third direction is parallel to a light-outgoing direction of the display panel.

4. The display panel of claim 3, wherein the first sub-metal subsection is located on at least one of a first end of the each of the plurality of first metal subsections or a second end of the each of the plurality of first metal subsections, and the first end is opposite to the second end in the second direction.

5. The display panel of claim 3, wherein each of the first-type baffle wall structures comprises a first sub-baffle-wall structure and a second sub-baffle-wall structure laminated in the third direction; and
    each of the second-type baffle wall structures is disposed on a same layer and has a same height as the first sub-baffle-wall structure, or each of the second-type baffle wall structures is disposed on a same layer and has a same height as the second sub-baffle-wall structure.

6. The display panel of claim 2, wherein the light-emitting substrate comprises a light-emitting diode light-emitting substrate; and the light-emitting diode light-emitting substrate comprises a cathode layer multiplexed as the electrode layer.

7. The display panel of claim 6, wherein the cathode layer comprises a first cathode subsection and a second cathode subsection which are disposed independently, adjacent ones of the plurality of first metal subsections along the second direction are electrically connected through the first cathode subsection, and the second cathode subsection serves as a common cathode for the plurality of light-emitting diodes in the light-emitting diode light-emitting substrate;
along a third direction, a thickness of the first cathode subsection is greater than a thickness of the second cathode subsection, and the third direction is parallel to a light-outgoing direction of the display panel.

8. The display panel of claim 2, wherein the light-emitting substrate comprises a light-emitting diode light-emitting substrate;
the light-emitting diode light-emitting substrate comprises a eutectic layer, and the eutectic layer is multiplexed as the electrode layer, and
the eutectic layer comprises a first eutectic subsection and a second eutectic subsection, adjacent ones of the plurality of first metal subsections along the second direction are in contact with and electrically connected to the first eutectic subsection, and the second eutectic subsection serves as an eutectic electrode of the plurality of light-emitting diodes in the light-emitting diode light-emitting substrate.

9. The display panel of claim 8, wherein the eutectic layer further comprises a third eutectic subsection, a vertical projection of the third eutectic subsection on a plane where the base is located overlaps vertical projections of the plurality of the second metal subsections and a part of each of the plurality of the first metal subsections on the plane where the base is located; and
along a third direction, a thickness of the third eutectic subsection is less than a thickness of the first eutectic subsection, and the third direction is parallel to a light-outgoing direction of the display panel.

10. The display panel of claim 1, wherein the adjacent ones of the plurality of first metal subsections along the second direction are electrically connected to each other by at least two first electrode subsections.

11. The display panel of claim 1, wherein the adjacent ones of the plurality of second metal subsections along the first direction are electrically connected to each other by at least one connection portion, and the at least one connection portion is disposed in a same layer as the first reflective subsection.

12. The display panel of claim 1, wherein the light-emitting substrate further comprises a filling structure located between each of the first electrode subsections and the second electrode subsection; and
a dielectric constant of the filling structure is less than a dielectric constant of air.

13. The display panel of claim 1, wherein the base further comprises a non-display area; the display panel further comprises a touch electrode trace disposed in the non-display area; and
the touch electrode trace comprises a first-type touch electrode trace and a second-type touch electrode trace, wherein the first-type touch electrode trace is electrically connected to the first-type touch electrodes and the second-type touch electrode trace is electrically connected to the second-type touch electrodes, and wherein the first-type touch electrode trace and the second-type touch electrode trace are disposed on a same layer as the first reflective subsection.

14. The display panel of claim 1, wherein
the baffle wall layer further comprises a plurality of baffle wall openings, and each of the plurality of baffle wall openings is disposed between adjacent ones of the plurality of baffle wall structures; and
the reflective metal layer further comprises a second reflective subsection, and the second reflective subsection covers a surface on a side, close to the plurality of baffle wall openings, of each of at least one of the plurality of baffle wall structures.

15. A preparation method for a display panel, comprising:
preparing a color filter substrate and a light-emitting substrate separately,
wherein preparing the color film substrate comprises:
providing a base, wherein the base comprises a display area;
forming a baffle wall layer, wherein the baffle wall layer is located on a side, close to the light-emitting substrate, of the substrate and comprises a plurality of baffle wall structures;
forming a reflective metal layer, wherein the reflective metal layer at least comprises a first reflective subsection, the first reflective subsection covers a surface of each of at least one of the plurality of baffle wall structures, the surface being at a side of the each of the at least one of the plurality of baffle wall structures facing the light-emitting substrate;
etching the first reflective subsection to form a plurality of first metal subsections and a plurality of second metal subsections, wherein on a plane where the first reflective subsection is located, adjacent ones of the plurality of first metal subsections are disposed independently, and adjacent ones of the plurality of second metal subsections along a first direction are connected to each other; the plurality of first metal subsections are multiplexed as first-type touch electrodes, and the plurality of second metal subsections are multiplexed as second-type touch electrodes; and
wherein preparing the light-emitting substrate comprises:
forming a plurality of light-emitting diodes and an electrode layer, wherein the electrode layer is located on a side, close to the color filter substrate, of the light-emitting substrate, wherein the reflective metal layer is located between the baffle wall layer and the electrode layer, wherein the electrode layer comprises first electrode subsections and a second electrode subsection which are disposed independently, and adjacent ones of the plurality of first metal subsections along a second direction are electrically connected to each other through at least one first electrode subsection; the first direction and the second direction intersect and are both parallel to a plane where the plurality of first metal subsections is located.

16. The preparation method of claim 15, wherein the plurality of baffle wall structures comprise first-type baffle wall structures and second-type baffle wall structures;
each of the plurality of first metal subsections comprises a first sub-metal subsection and a second sub-metal subsection, a vertical projection of the first sub-metal subsection on a plane where the base is located overlaps a vertical projection of a respective one of the first-type baffle wall structures on the plane where the base is located, a vertical projection of each of the second-type baffle wall structures on the plane where the base is located overlaps a vertical projection of the second sub-metal subsection of a respective one of the plurality of first metal subsections and a vertical projection of a respective one of the plurality of second metal subsections on the plane where the substrate is located; and forming the plurality of baffle wall structures comprises:
forming the first-type baffle wall structure and the second-type baffle wall structure by using a semi-mask process, wherein along a third direction, a height of each of the first-type baffle wall structures is greater than a height of each of second-type baffle wall structures, and the third direction is parallel to a light-outgoing direction of the display panel.

17. The preparation method of claim 15, wherein the plurality of baffle wall structures comprise first-type baffle wall structures and second-type baffle wall structures;

each of the plurality of first metal subsections comprises a first sub-metal subsection and a second sub-metal subsection, a vertical projection of the first sub-metal subsection on a plane where the substrate is located overlaps a vertical projection of a respective one of the first-type baffle wall structures on the plane where the substrate is located, a vertical projection of each of the second-type baffle wall structures on the plane where the base is located overlaps a vertical projection of the second sub-metal subsection of a respective one of the plurality of first metal subsections and a vertical projection of a respective one of the plurality of second metal subsections on the plane where the substrate is located; and forming the plurality of baffle wall structures comprises one of:

forming a first sub-baffle-wall structure of each of the first-type baffle wall structures by using a first mask process; and forming each of the second-type baffle wall structures and a second sub-baffle-wall structure of each of the first-type baffle wall structures by using a second mask process, wherein the second sub-baffle-wall structure is located on a side, close to the light-emitting substrate, of the first sub-baffle-wall structure, and each of the second-type baffle wall structures is disposed on a same layer and has a same height as the second sub-baffle-wall structure; or forming each of the second-type baffle wall structures and a first sub-baffle-wall structure of each of the first-type baffle wall structures by using a first mask process, wherein each of the second-type baffle wall structures is disposed on a same layer and has a same height as the first sub-baffle-wall structure; and forming a second sub-baffle-wall structure of each of the first-type baffle wall structures by using a second mask process, wherein the second sub-baffle-wall structure is located on a side, close to the light-emitting substrate, of the first sub-baffle-wall structure.

18. The preparation method of claim 15, wherein the light-emitting substrate comprises a light-emitting diode light-emitting substrate;

forming the electrode layer comprising the first electrode subsections and the second electrode subsection which are disposed independently comprises:
forming a cathode layer;

etching the cathode layer to obtain a first cathode structure and a second cathode structure which are disposed independently, wherein along a third direction, a thickness of the first cathode structure is same as a thickness of the second cathode structure, and the third direction is parallel to a light-outgoing direction of the display panel; and preparing a cathode additional structure on a side of the first cathode structure, wherein along the third direction, the cathode additional structure and the first cathode structure are laminated to obtain a first cathode subsection, and the second cathode structure is a second cathode subsection; along the third direction, a thickness of the first cathode subsection is greater than a thickness of the second cathode subsection; adjacent ones of the plurality of first metal subsections along the second direction are in contact with and electrically connected to the first cathode subsection, and the second cathode subsection serves as a common cathode for the plurality of light-emitting diodes in the light-emitting diode light-emitting substrate.

19. The preparation method of claim 15, wherein the light-emitting substrate comprises a light-emitting diode light-emitting substrate;

forming the electrode layer comprising the first electrode subsections and the second electrode subsection which are disposed independently comprises:
forming a eutectic layer; and
etching the eutectic layer to obtain a first eutectic subsection and a second eutectic subsection, wherein adjacent ones of the plurality of first metal subsections along the second direction are in contact with and electrically connected to the first eutectic subsection, and the second eutectic subsection serves as an eutectic electrode of the plurality of light-emitting diodes in the light-emitting diode light-emitting substrate.

20. A display device, comprising a display panel, wherein the display panel comprises: a light-emitting substrate and a color filter substrate which are disposed opposite to each other, wherein the color filter substrate comprises:
a base, which comprises a display area;
a baffle wall layer located on one side of the base and located in the display area, wherein the baffle wall layer comprises a plurality of baffle wall structures; and
a reflective metal layer, wherein the reflective metal layer at least comprises a first reflective subsection, and the first reflective subsection covers a surface of each of at least one of the plurality of baffle wall structures, the surface being at a side of the each of the at least one of the plurality of baffle wall structures facing the light-emitting substrate, wherein the first reflective subsection comprises a plurality of first metal subsections and a plurality of second metal subsections; on a plane where the first reflective subsection is located, adjacent ones of the plurality of first metal subsections are independently disposed, and adjacent ones of the plurality of second metal subsections along a first direction are connected to each other; and the plurality of first metal subsections are multiplexed as first-type touch electrodes, and the plurality of second metal subsections are multiplexed as second-type touch electrodes; and the light-emitting substrate comprises:
a plurality of light-emitting diodes and an electrode layer, wherein the electrode layer is disposed on a side, close to the color filter substrate, of the light-emitting substrate, wherein the reflective metal layer is located between the baffle wall layer and the electrode layer, wherein the electrode layer comprises first electrode subsections and a second electrode subsection which are disposed independently, and adjacent ones of the plurality of first metal subsections along a second direction are electrically connected to each other through at least one first electrode subsection; and the first direction and the second direction intersect and are both parallel to the plane where the first reflective subsection is located.

* * * * *